(12) United States Patent
Apalkov et al.

(10) Patent No.: US 9,490,421 B2
(45) Date of Patent: Nov. 8, 2016

(54) METHOD AND SYSTEM FOR PROVIDING VERTICAL SPIN TRANSFER SWITCHED MAGNETIC JUNCTIONS AND MEMORIES USING SUCH JUNCTIONS

(71) Applicants: Dmytro Apalkov, San Jose, CA (US); Alexey Vasilyevitch Khvalkovskiy, Milpitas, CA (US); Vladimir Nikitin, Campbell, CA (US); Steven M. Watts, Mountain View, CA (US)

(72) Inventors: Dmytro Apalkov, San Jose, CA (US); Alexey Vasilyevitch Khvalkovskiy, Milpitas, CA (US); Vladimir Nikitin, Campbell, CA (US); Steven M. Watts, Mountain View, CA (US)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 499 days.

(21) Appl. No.: 13/751,304

(22) Filed: Jan. 28, 2013

(65) Prior Publication Data

US 2014/0175577 A1 Jun. 26, 2014

Related U.S. Application Data

(60) Provisional application No. 61/745,542, filed on Dec. 21, 2012.

(51) Int. Cl.
| | |
|---|---|
| *H01L 29/82* | (2006.01) |
| *H01L 21/02* | (2006.01) |
| *H01L 43/08* | (2006.01) |
| *H01L 43/12* | (2006.01) |
| *H01F 10/32* | (2006.01) |
| *G11C 11/16* | (2006.01) |

(52) U.S. Cl.
CPC ............ *H01L 43/08* (2013.01); *G11C 11/161* (2013.01); *H01F 10/3254* (2013.01); *H01F 10/3272* (2013.01); *H01L 43/12* (2013.01)

(58) Field of Classification Search
CPC ..... H01F 10/32; H01L 43/08; H01L 27/222; H01L 29/82; H01L 43/12
USPC .......................................................... 257/421
See application file for complete search history.

(56) References Cited

U.S. PATENT DOCUMENTS

| | | | | |
|---|---|---|---|---|
| 6,621,730 | B1 * | 9/2003 | Lage ..................... | B82Y 10/00 257/E21.665 |
| 7,180,712 | B1 * | 2/2007 | Li .......................... | G11B 5/112 257/E43.004 |
| 7,319,262 | B2 | 1/2008 | Liu et al. | |
| 7,443,633 | B2 | 10/2008 | Tagami et al. | |
| 7,732,223 | B2 * | 6/2010 | Park ....................... | H01L 43/12 257/421 |
| 2003/0183889 | A1 * | 10/2003 | Kajiyama ............. | G11C 11/155 257/421 |

(Continued)

FOREIGN PATENT DOCUMENTS

| | | |
|---|---|---|
| JP | 10270244 | 9/1998 |
| JP | 2001-143929 | 5/2001 |

(Continued)

*Primary Examiner* — Jerome Jackson, Jr.
*Assistant Examiner* — David Spalla
(74) *Attorney, Agent, or Firm* — Convergent Law Group LLP

(57) ABSTRACT

A method and system provide a magnetic junction usable in a magnetic device and which resides on a substrate. The magnetic junction includes a reference layer, a nonmagnetic spacer layer, and a free layer. The nonmagnetic spacer layer is between the reference layer and the free layer. The free layer, the nonmagnetic spacer layer and the reference layer form nonzero angle(s) with the substrate. The magnetic junction is configured such that the free layer is switchable between a plurality of stable magnetic states when a write current is passed through the magnetic junction.

48 Claims, 11 Drawing Sheets

(56) References Cited

U.S. PATENT DOCUMENTS

| | | | |
|---|---|---|---|
| 2006/0033133 A1* | 2/2006 | Liu | H01L 27/228 257/295 |
| 2006/0033136 A1* | 2/2006 | Liu et al. | 257/296 |
| 2008/0273380 A1* | 11/2008 | Diao | G11C 11/16 365/171 |
| 2009/0323406 A1* | 12/2009 | Ochiai | G11C 11/14 365/158 |
| 2010/0003767 A1 | 1/2010 | Cho | |
| 2012/0243127 A1* | 9/2012 | Iwasaki | G01R 33/093 360/290 |
| 2013/0155754 A1* | 6/2013 | Apalkov et al. | 365/80 |
| 2014/0062530 A1* | 3/2014 | Miao | H01L 43/08 326/37 |

FOREIGN PATENT DOCUMENTS

| | | |
|---|---|---|
| JP | 2007-109807 | 4/2007 |
| JP | 2008-78214 | 4/2008 |
| KR | 1020090114145 | 11/2009 |
| KR | 1020090114681 | 11/2009 |
| KR | 1020120019115 | 3/2012 |

* cited by examiner

METHOD AND SYSTEM FOR PROVIDING VERTICAL SPIN TRANSFER SWITCHED MAGNETIC JUNCTIONS AND MEMORIES USING SUCH JUNCTIONS

CROSS-REFERENCE TO RELATED APPLICATIONS

This application claims the benefit of provisional Patent Application Ser. No. 61/745,542, filed Dec. 21, 2012, entitled METHOD AND SYSTEM FOR PROVIDING VERTICAL SPIN TRANSFER SWITCHED MAGNETIC JUNCTIONS AND MEMORIES USING SUCH JUNCTIONS assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a bottom contact 11, uses conventional seed layer(s) 12 and includes a conventional antiferromagnetic (AFM) layer 14, a conventional reference layer 16, a conventional tunneling barrier layer 18, a conventional free layer 20, and a conventional capping layer 22. Also shown is top contact 24.

Conventional contacts 11 and 24 are used in driving the current in a current-perpendicular-to-plane (CPP) direction, or along the z-axis as shown in FIG. 1. The conventional seed layer(s) 12 are typically utilized to aid in the growth of subsequent layers, such as the AFM layer 14, having a desired crystal structure. The conventional tunneling barrier layer 18 is nonmagnetic and is, for example, a thin insulator such as MgO.

The conventional reference layer 16 and the conventional free layer 20 are magnetic. The magnetization 17 of the conventional reference layer 16 is fixed, or pinned, in a particular direction, typically by an exchange-bias interaction with the magnetization of AFM layer 14. Although depicted as a simple (single) layer, the conventional reference layer 16 may include multiple layers. For example, the conventional reference layer 16 may be a synthetic antiferromagnetic (SAF) layer including magnetic layers antiferromagnetically coupled through thin conductive layers, such as Ru. In such a SAF, multiple magnetic layers interleaved with a thin layer of Ru may be used. In another embodiment, the coupling across the Ru layers can be ferromagnetic. Further, other versions of the conventional MTJ 10 might include an additional reference layer (not shown) separated from the free layer 20 by an additional nonmagnetic barrier or conductive layer (not shown).

The conventional free layer 20 has a changeable magnetization 21. Although depicted as a simple layer, the conventional free layer 20 may also include multiple layers. For example, the conventional free layer 20 may be a synthetic layer including magnetic layers antiferromagnetically or ferromagnetically coupled through thin conductive layers, such as Ru. Although shown as in-plane, the magnetization 21 of the conventional free layer 20 may have a perpendicular anisotropy. Thus, the reference layer 16 and free layer 20 may have their magnetizations 17 and 21, respectively oriented perpendicular to the plane of the layers.

To switch the magnetization 21 of the conventional free layer 20, a current is driven perpendicular to plane (in the z-direction). When a sufficient current is driven from the top contact 24 to the bottom contact 11, the magnetization 21 of the conventional free layer 20 may switch to be parallel to the magnetization 17 of the conventional reference layer 16. When a sufficient current is driven from the bottom contact 11 to the top contact 24, the magnetization 21 of the free layer may switch to be antiparallel to that of the reference layer 16. The differences in magnetic configurations correspond to different magnetoresistances and thus different logical states (e.g. a logical "0" and a logical "1") of the conventional MTJ 10. Thus, by reading the tunneling magnetoresistance (TMR) of the conventional MTJ 10 the state of the conventional MTJ can be determined.

Although the conventional MTJ 10 may be written using spin transfer, read by sensing the TMR of the junction, and used in an STT-MRAM, there are drawbacks. For example, the footprint of the conventional MTJ 10 is desired to be reduced to scale the conventional MTJ to lower sizes. Reducing the size of the conventional MTJ 10 allows the areal density of memories employing the conventional magnetic junction 10 to be increased. However, reducing the size of the conventional free layer 16 decreases the amount of magnetic material present in the free layer 16 and thus may adversely affect thermal stability. A reduction in the thermal stability of the conventional MTJ 10 negatively impacts the ability of the conventional MTJ 10 to reliably store data over time. Thus, performance of the conventional MTJ suffers.

Accordingly, what is needed is a method and system that may improve the performance of the spin transfer torque based memories. The method and system described herein address such a need.

BRIEF SUMMARY OF THE INVENTION

A method and system provide a magnetic junction usable in a magnetic device and which resides on a substrate. The magnetic junction includes a reference layer, a nonmagnetic spacer layer, and a free layer. The nonmagnetic spacer layer is between the reference layer and the free layer. The free layer, the nonmagnetic spacer layer and the reference layer form nonzero angle(s) with the substrate. The magnetic junction is configured such that the free layer is switchable between a plurality of stable magnetic states when a write current is passed through the magnetic junction.

DETAILED DESCRIPTION OF THE INVENTION

Figure 1:
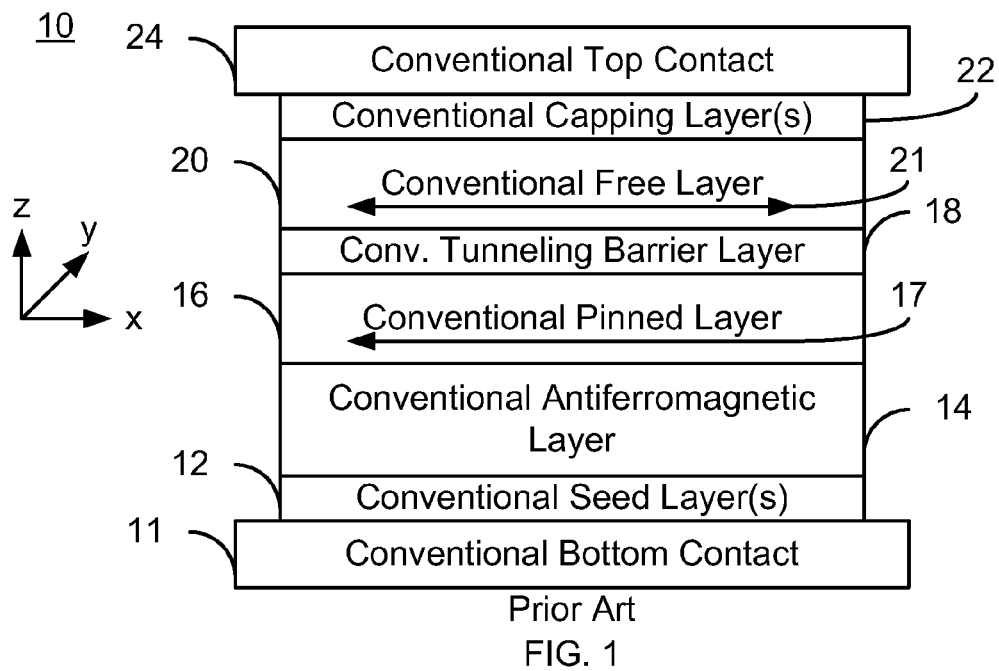
FIG. 1 depicts a conventional magnetic junction.

The exemplary embodiments relate to magnetic junctions usable in magnetic devices, such as magnetic memories, and the devices using such magnetic junctions. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

Methods and systems provide a magnetic junction as well as a magnetic memory utilizing the magnetic junction. The magnetic junction includes a reference layer, a nonmagnetic spacer layer, and a free layer. The nonmagnetic spacer layer is between the reference layer and the free layer. The free layer, the nonmagnetic spacer layer and the reference layer form nonzero angle(s) with the substrate. The magnetic junction is configured such that the free layer is switchable between a plurality of stable magnetic states when a write current is passed through the magnetic junction.

The exemplary embodiments are described in the context of particular magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomenon. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. For example, other angles between the layers of the magnetic junction and the underlying substrate other than zero are possible. In addition, the method and system are described in the context of certain layers being synthetic and/or simple. However, one of ordinary skill in the art will readily recognize that the layers could have another structure. Furthermore, the method and system are described in the context of magnetic junctions and/or free layers having particular layers. However, one of ordinary skill in the art will readily recognize that magnetic junctions and/or free layers having additional and/or different layers not inconsistent with the method and system could also be used. Moreover, certain components are described as being magnetic, ferromagnetic, and ferrimagnetic. As used herein, the term magnetic could include ferromagnetic, ferrimagnetic or like structures. Thus, as used herein, the term "magnetic" or "ferromagnetic" includes, but is not limited to ferromagnets and ferrimagnets. The method and system are also described in the context of single magnetic junctions and free layers. However, one of ordinary skill in the art will readily recognize that the method and system are consistent with the use of magnetic memories having multiple magnetic junctions and using multiple free layers. Further, as used herein, "in-plane" is substantially within or parallel to the plane of one or more of the layers of a magnetic junction. Conversely, "perpendicular" corresponds to a direction that is substantially perpendicular to one or more of the layers of the magnetic junction.

Figure 2:
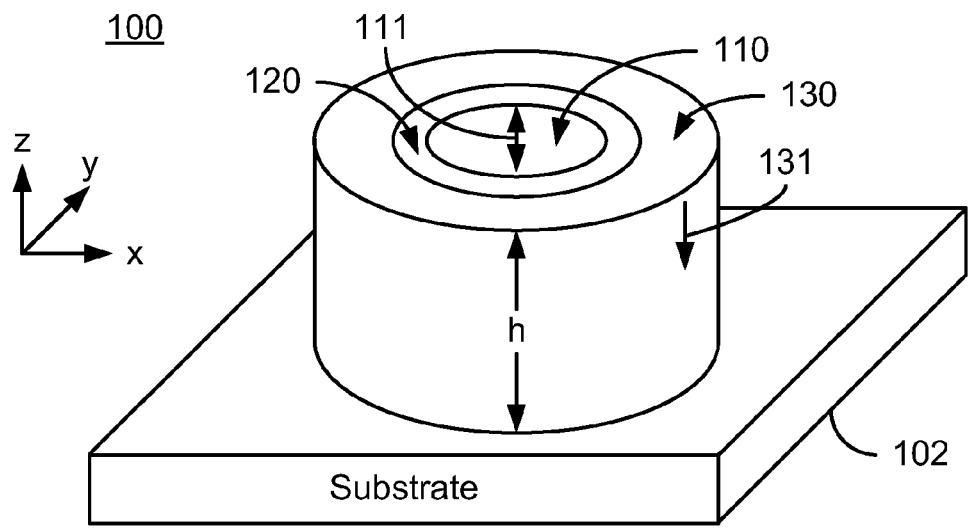
FIGS. 2-3 depict an exemplary embodiment of a vertical magnetic junction switchable using spin transfer.
Figure 3:
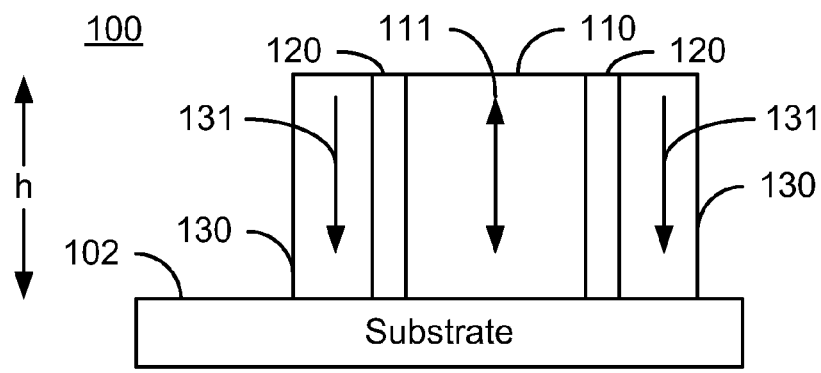

FIGS. 2-3 depict perspective and cross-sectional views, respectively, of an exemplary embodiment of a vertical magnetic junction 100 switchable using spin transfer. The magnetic junction may be, for example a magnetic tunneling junction (MTJ), spin valve, or ballistic magnetoresistance structure, or some combination thereof. The magnetic junction 100 may be used in a variety of applications. For example, the magnetic junction may be used in a magnetic memory such as an STT-MRAM. For clarity, FIGS. 2-3 are not to scale. The magnetic junction includes a free layer 110, a nonmagnetic spacer layer 120 and a pinned or reference layer 130. The magnetic junction 100 is shown as residing on a substrate 102. In some embodiments, the magnetic junction 100 may include seed layer(s) and/or capping layer(s) (not shown).

The magnetic junction 100 is a vertical magnetic junction. In a vertical magnetic junction, the layers of the magnetic junction are oriented at a nonzero angle from the substrate layer. Thus, the smallest dimension of the free layer 110, nonmagnetic spacer layer 120 or reference layer 130 is oriented at a nonzero angle from the smallest dimension of the substrate 102. In a conventional magnetic junction, the smallest dimension is the thickness, which is parallel to the thickness of the substrate. In the magnetic junction 100, the thickness of each of the layers 110, 120 and 130 is in the radial direction (the x-y plane). The smallest dimension of the substrate 102 is in the z-direction. Conversely, the larger surfaces for the layers 110, 120 and 130 are perpendicular to the plane formed by the substrate 102. For example, because the layers 110, 120 and 130 are concentric rings (e.g. cylinders), the largest surfaces, or "plane" of the layers 120, 130 and 140 may be considered to be in the z-direction, which is perpendicular to the substrate in the x-y plane. The nonzero angle between the layers 110, 120 and 130 and the substrate 102 can also be seen from the perspective of interfaces between the layers 110, 120 and 130 and the surface of the substrate 102. For the vertical magnetic junction 100, the interfaces between the free layer 110 and the nonmagnetic spacer layer 120 and between the nonmagnetic spacer layer 120 and the reference layer 130 form nonzero angles with the top substantially planar top surface of the substrate 102. The nonzero angle may also be viewed as the angle between the sidewalls (larger surfaces) of the layers 110, 120 and/or 130 and the surface of the substrate.

In the embodiment shown, the free layer 110, nonmagnetic spacer layer 120 and reference layer 130 are substantially perpendicular to the top surface of the substrate 102. Thus, the nonzero angle in FIGS. 2-3 is substantially ninety degrees. The nonzero angle for the magnetic junction 100, therefore, may be substantially ninety degrees within processing variations. In other embodiments, other angles are possible. In some embodiments, the free layer 110, nonmagnetic spacer layer 120 and reference layer 130 are at an angle of at least forty-five degrees from the top surface of the substrate. In some such embodiments, the angle between the layers 110, 120 and 130 and the substrate 102 is 80-90 degrees. In other words, the layers 110, 120 and 130 are within ten degrees of being perpendicular to the substrate 102.

The nonmagnetic spacer layer 120 may be a tunneling barrier layer, conductor, or other structure for which magnetoresistance is exhibited between the free layer 110 and the pinned layer 130. In some embodiments, the nonmagnetic spacer layer 120 is a crystalline MgO tunneling barrier layer. Such a nonmagnetic spacer layer may have a preferred crystallographic orientation, such as a (100) orientation.

The free layer 110 and reference layer 130 are ferromagnetic. Although depicted as simple layers, the free layer 110 and/or the reference layer 130 may include multiple layers. For example, the free layer 110 and/or the reference layer 130 may be a SAF including magnetic layers antiferromagnetically or ferromagnetically coupled through thin layers, such as Ru. In such a SAF, multiple magnetic layers interleaved with thin layer(s) of Ru or other material may be used. The free layer 110 and/or the reference layer 130 may also be another multilayer.

The free layer magnetic moment 111 is switchable using spin transfer and thus is shown by a dual arrow 111. The magnetic moment 131 of the reference layer 130 may be fixed in a particular direction. In the embodiment shown, the magnetic moment 131 of the reference layer 130 is in the negative z-direction. In another embodiment, the magnetic moment 131 may be in the positive z direction. In other embodiments, the magnetic moment of the free layer 110 and/or the reference layer 130 may be stable in another direction. Other orientations of the magnetic moments of the free layer 110 and/or the reference layer 130 are, therefore, possible.

Note that in the embodiment shown, the magnetic moments 111 and 131 may be considered to be in plane for the layers 110 and 130. The largest surfaces of the layers 110 and 130 are at surfaces around the z-axis. The magnetic moments 111 and 131 are also perpendicular to the direction between the interfaces (i.e. perpendicular to the radial direction). Thus, for the vertical magnetic junction 100, the magnetic moments 111 and 131 are considered in plane even though the magnetic moments 111 and 131 are perpendicular to the substrate 102.

Although layers 110, 120, and 130 are shown with a particular orientation, this orientation may vary in other embodiments. For example, the reference layer 130 may be closer to the center of the magnetic junction 100. A pinning layer (not shown) may also be used. The magnetic junction 100 is also configured to allow the free layer 110 to be switched between stable magnetic states when a write current is passed through the magnetic junction 100. Thus, the magnetic moment 111 of the free layer 110 is switchable utilizing spin transfer torque. Because the magnetic moment 111 is switchable, the magnetic moment 111 is indicated by a dual headed arrow. Note that in some embodiments, a magnetic field may be used in conjunction with spin transfer torque to switch the state of the free layer 110.

The magnetic junction 100 may have improved performance at higher areal densities. The footprint of the magnetic junction 100 may be reduced by reducing the radius of the free layer 110, as well as the radii of the nonmagnetic spacer layer 120 and the reference layer 130. For example, the diameter of the magnetic junction 100 may be less than ten nanometers. Without more, the reduction in the radius of the free layer 110 would reduce the amount of magnetic material in the free layer 110. This may make the free layer 110 less magnetically stable. However, the height, h, of the free layer 110 may be increased as the radius is decreased. The increase in the height of the free layer 110 may at least partially compensate for the reduction in the radius. As a result, the free layer 110 may remain magnetically stable at smaller footprints (areal size) of the magnetic junction 100. Moreover, it is noted that the increase in the height of the free layer 110 may increase the shape anisotropy that aids in the maintaining the magnetic stability of the free layer. Again, the free layer 110 may be more magnetically stable at smaller sizes of the magnetic junction 100. Further, the magnetic junction 100 may have a better controlled resistance area product (RA). For example, changes in height, h, of the magnetic junction 100 may be used to adjust the RA of the magnetic junction 100 to be in the desired range.

Figure 4:
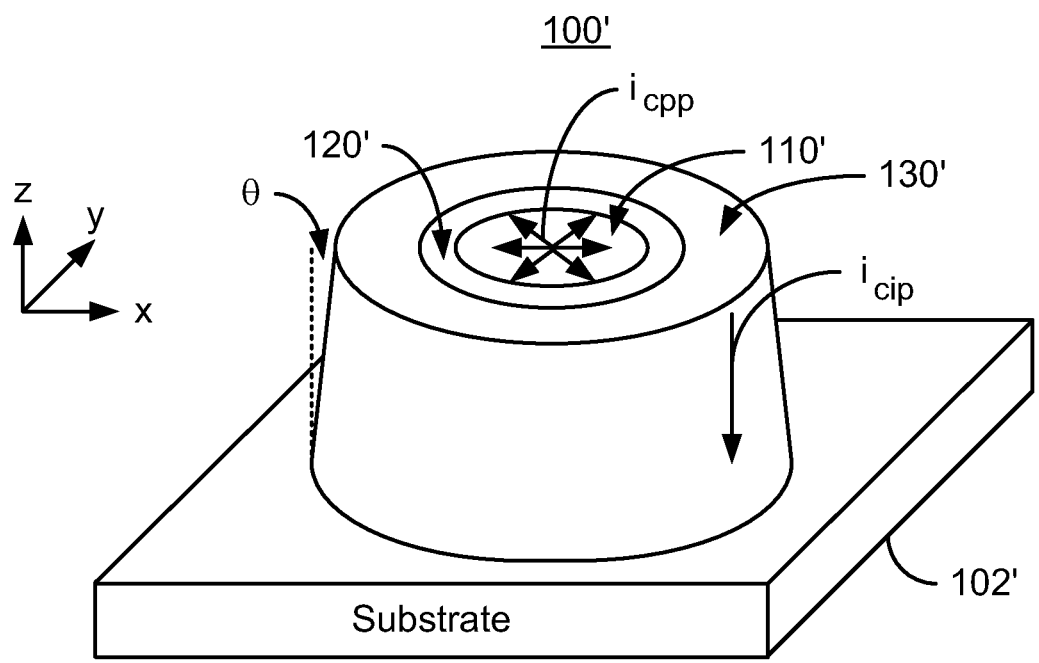
FIG. 4 depicts another exemplary embodiment of a vertical magnetic junction switchable using spin transfer.

FIG. 4 depicts another exemplary embodiment of a vertical magnetic junction 100' switchable using spin transfer. For clarity, FIG. 4 is not to scale. The magnetic junction 100' is analogous to the magnetic junction 100. Thus, analogous layers are labeled similarly. The magnetic junction 100' includes a free layer 110', a nonmagnetic spacer layer 120', and a reference layer 130' analogous to the layers 110, 120, and 130, respectively. The free layer 110' and reference layer 130' are depicted as having magnetic moments 111' and 131', respectively. In other embodiments, the magnetic moments 111' and 131' may have another orientation. In addition, one or both of the layers 110' and 130' may be a synthetic antiferromagnetic layer or other multilayer. Although layers 110', 120', and 130' are shown with a particular orientation, this orientation may vary in other embodiments. For example, the reference layer 130' may be closest to the center of the magnetic junction 100'. In some embodiments, an optional seed layer (not shown), an optional pinning layer (not shown) and/or optional capping layer (not shown) may be included. The magnetization of the free layer 110' is switchable utilizing spin transfer torque.

FIG. 4 indicates possible direction of write current flow for the magnetic junction 100 or 100'. If current flows perpendicular to the plane of the layers 110', 120' and 130', the perpendicular-to-plane write current, $i_{cpp}$, flows radially from the free layer 110' to the reference layer 130', or vice versa. Thus, although $i_{cpp}$ is depicted as flowing outward, the current may flow inward, toward the central axis of the magnetic junction. In some embodiments, the magnetic junction 100' has one contact (not shown in FIG. 4) at the top surface or bottom surface of the free layer 110'. In other embodiments, the contact may be at the center (e.g. along the central axis) of the free layer 110'. In some embodiments, the other contact is at the bottom or top surface of the reference layer 130'. In other embodiments, the other contact surrounds the outside of the reference layer 130'. If current flows in the plane of the layers 110', 120' and 130', the current-in-plane write current, $i_{cip}$, flows vertically (along the z-axis). Thus, although $i_{cip}$ is shown as flowing in the negative z direction, current may flow in the positive z direction to change the state of the free layer.

As discussed above, the magnetic junction 100' is a vertical magnetic junction. As a result, the layers 110', 120' and 130' are at a nonzero angle with respect to the substrate 102'. However, in the embodiment shown in FIG. 4, the sidewalls of the magnetic junction are not perfectly vertical. Instead, the sidewalls form an angle, θ, with the z-axis. In some embodiments, θ is not more than ten degrees. In some such embodiments, θ is within processing limitations of zero.

The magnetic junction 100' may share the benefits of the magnetic junction 100. In particular, the magnetic junction 100' may be scalable to higher areal densities. For example, the magnetic junction 100' may have acceptable performance and thermal stability at a diameter of less than ten nanometers. Further, the magnetic junction 100' may have a better controlled resistance area product (RA). Thus, the magnetic junction 100' may have improved performance.

Figure 5:
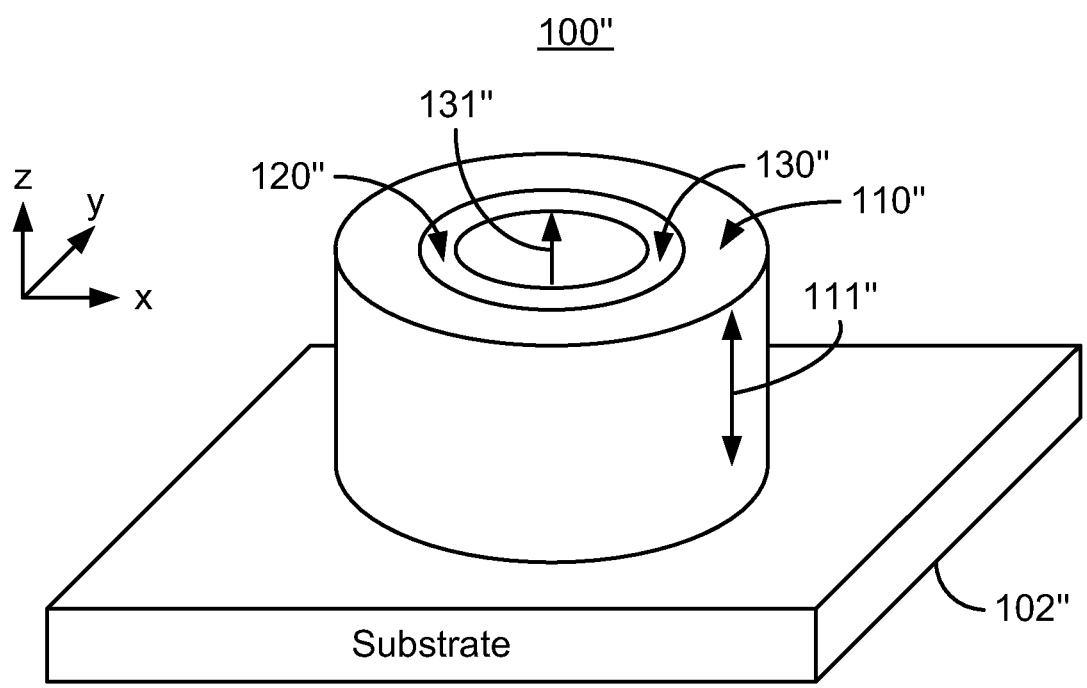
FIG. 5 depicts an exemplary embodiment of vertical magnetic junction switchable using spin transfer.
Figure 6:
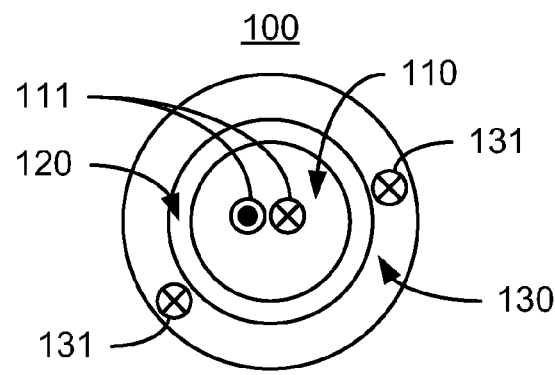
FIG. 6 depicts another exemplary embodiment of another vertical magnetic junction switchable using spin transfer.
Figure 7:
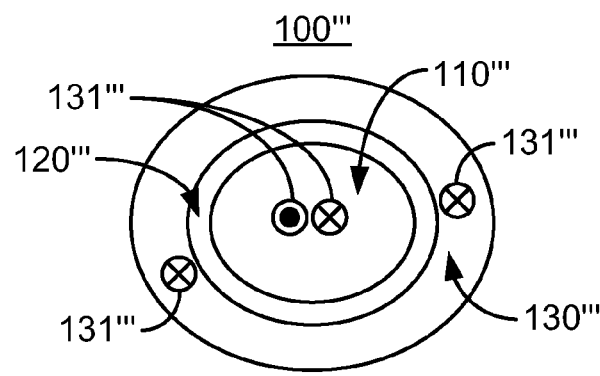
FIG. 7 depicts another exemplary embodiment of another vertical magnetic junction switchable using spin transfer.
Figure 8:
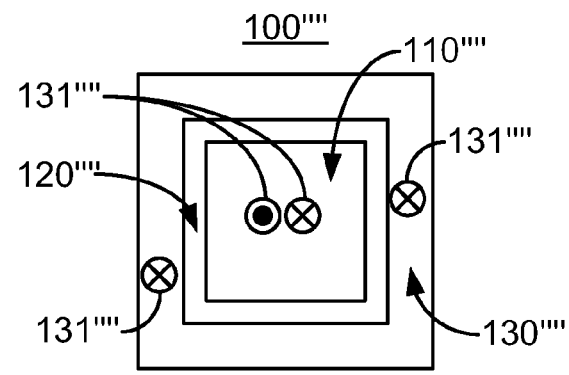
FIG. 8 depicts another exemplary embodiment of a vertical magnetic junction switchable using spin transfer.
Figure 9:
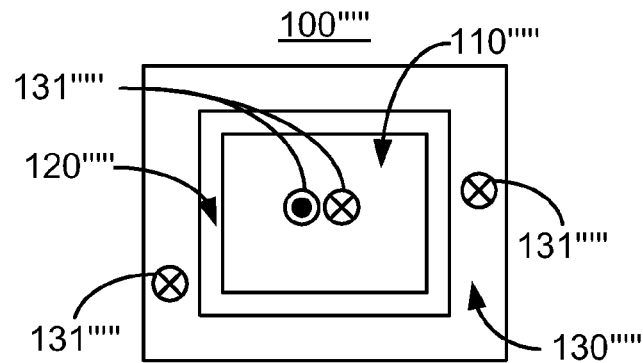
FIG. 9 depicts another exemplary embodiment of a vertical magnetic junction switchable using spin transfer.

FIG. 5 depicts another exemplary embodiment of a vertical magnetic junction 100" switchable using spin transfer. For clarity, FIG. 5 is not to scale. The magnetic junction 100" is analogous to the magnetic junctions 100 and 100'. Thus, analogous layers are labeled similarly. The magnetic junction 100" includes a free layer 110", a nonmagnetic spacer layer 120", and a reference layer 130" analogous to the layers 110/110', 120/120', and 130/130', respectively. The free layer 110" and reference layer 130" are depicted as having magnetic moments 111" and 131", respectively. In other embodiments, the magnetic moments 111" and 131" may have another orientation. In addition, one or both of the layers 110" and 130" may be a synthetic antiferromagnetic layer or other multilayer. Although layers 110", 120", and 130" are shown with a particular orientation, this orientation may vary in other embodiments. In some embodiments, an optional seed layer (not shown), an optional pinning layer (not shown) and/or optional capping layer (not shown) may be included. The magnetization of the free layer 110" is switchable utilizing spin transfer torque. The magnetic junction 100" is a vertical magnetic junction. Thus, the layers 110", 120" and 130" are at a nonzero angle with respect to the substrate 102". In the embodiment shown, the layers 110", 120" and 130" are substantially perpendicular to the substrate 102". However, in other embodiments, other nonzero angles are possible.

The magnetic junction 100" has its reference layer 130" at the center of the magnetic junction 100". The free layer 110' is at the outer edge of the magnetic junction 100". The nonmagnetic spacer layer 120" still remains between the free layer 110" and the reference layer 130".

The magnetic junction 100" may share the benefits of the magnetic junctions 100 and 100'. In particular, the magnetic junction 100" may be scalable to higher areal densities. For example, the magnetic junction 100" may have acceptable performance and thermal stability at a diameter of less than ten nanometers. Further, the magnetic junction 100" may have a better controlled resistance area product (RA) because the area of the working portion of nonmagnetic spacer layer is larger than the in-plane area occupied by the MRAM structure on the substrate. In other words, if the area occupied on the substrate is small, the total area of the nonmagnetic spacer can be made much larger by increasing total height of the stack. This makes it easier to control resistance of the overall structure by controlling height of the stack in addition to RA product. Thus, the magnetic junction 100" may have improved performance.

FIGS. 6-9 depict plan views of exemplary embodiments of the vertical magnetic junctions 100, 100''', 100'''' and 100'''''. For clarity, FIGS. 6-9 are not to scale. The magnetic junction 100 shown in FIG. 6 may be considered to be the same as the magnetic junction 100 depicted in FIGS. 2-3. Thus, the magnetic junction 100 has a circular footprint. The magnetic junction 100 may thus be a cylinder. The magnetic junctions 100''', 100'''' and 100''''' are analogous to the magnetic junctions 100, 100' and 100". Thus, analogous layers are labeled similarly. The magnetic junctions 100''', 100'''' and 100''''' each includes a free layer 110''', 110'''' and 110''''', a nonmagnetic spacer layer 120''', 120'''' and 120''''', and a reference layer 130''', 130'''' and 130''''', respectively, that are analogous to the layers 110/110'/110", 120/120'/120", and 130/130'/130", respectively. The free layers 110'''/110''''/110''''' and reference layer 130'''/130''''/130''''' are depicted as having magnetic moments 111'''/111''''/111''''' and 131'''/131''''/131''''', respectively. In other embodiments, the magnetic moments 111'''/111''''/111''''' and 131'''/131''''/131''''' may have another orientation. In addition, one or both of the layers 110'''/110''''/110''''' and 130'''/130''''/130''''' may be a synthetic antiferromagnetic layer or other multilayer. Although layers 110'''/110''''/110''''', 120'''/120''''/120''''', and 130'''/130''''/130''''' are shown with a particular orientation, this orientation may vary in other embodiments. In some embodiments, an optional seed layer (not shown), an optional pinning layer (not shown) and/or optional capping layer (not shown) may be included. The magnetization 111'''/111''''/111''''' of the free layer 110'''/110''''/110''''' is switchable utilizing spin transfer torque. The magnetic junctions 100'''/100''''/100''''' are a vertical magnetic junctions.

Thus, the layers 110/110'/110", 120/120'/120", and 130/130'/130" are at a nonzero angle with respect to the substrate 102'''/102''''/102'''''.

The vertical magnetic junctions 100''', 100'''' and 100''''' have different footprints than the magnetic junction 100. For example, the magnetic junction 100''' has an elliptical footprint. The magnetic junction 100'''' has a square footprint. The magnetic junction 100''''' has a rectangular footprint. Although various shapes are shown for the footprints of the magnetic junctions 100, 100''', 100'''' and 100''''' others may be used. However, in general, a footprint having no corners and that is symmetric may be desirable for improved performance.

The magnetic junctions 100''', 100'''' and 100''''' may share the benefits of the magnetic junctions 100, 100' and 100". In particular, the magnetic junctions 100''', 100'''' and 100''''' may be scalable to higher areal densities. For example, the magnetic junctions 100''', 100'''' and 100''''' may have acceptable performance and thermal stability at a diameter of less than ten nanometers. Further, the magnetic junctions 100''', 100'''' and 100''''' may have a better controlled resistance area product (RA). Thus, the magnetic junctions 100''', 100'''' and 100''''' may have improved performance.

Figure 10:
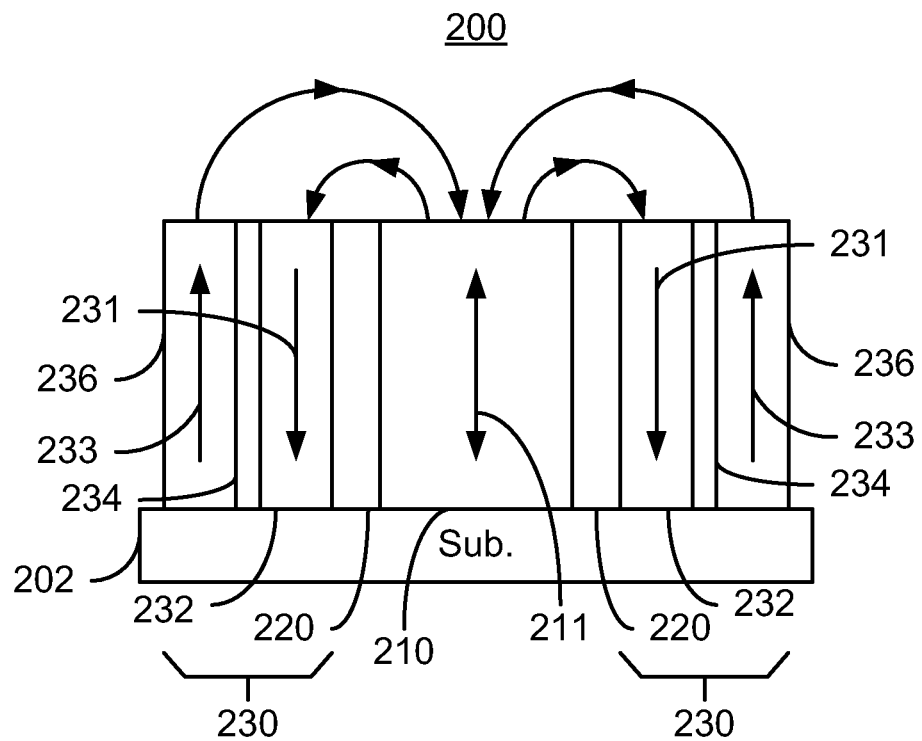
FIGS. 10-11 depict another exemplary embodiment of a vertical magnetic junction switchable using spin transfer.
Figure 11:
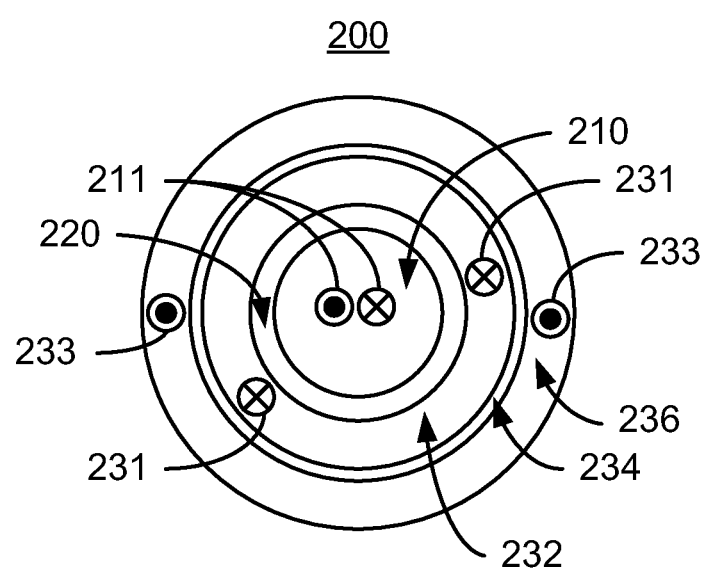

FIGS. 10-11 depict side and plan views of another exemplary embodiment of a vertical magnetic junction 200 switchable using spin transfer. For clarity, FIGS. 10-11 are not to scale. The magnetic junction 200 is analogous to the magnetic junctions 100, 100', 100", 100''', 100'''' and 100'''''. Thus, analogous layers are labeled similarly. The magnetic junction 200 includes a free layer 210, a nonmagnetic spacer layer 220, and a reference layer 230 analogous to the layers 110/110'/110"/110'''/110''''/110''''', 120/120'/120"/120'''/120''''/120''''', and 130/130'/130"/130'''/130''''/130''''', respectively. Although layers 210, 220, and 230 are shown with a particular orientation, this orientation may vary in other embodiments. For example, the reference layer 230 may be at the center of the magnetic junction 200, while the free layer 210 is at the perimeter. In some embodiments, an optional seed layer (not shown), an optional pinning layer (not shown) and/or optional capping layer (not shown) may be included. The magnetization of the free layer 210 is switchable utilizing spin transfer torque. The magnetic junction 210 is a vertical magnetic junction. Thus, the layers 210, 220 and 230 are at a nonzero angle with respect to the substrate 202. In the embodiment shown, the layers 210, 220 and 230 are substantially perpendicular to the substrate 202. However, in other embodiments, other nonzero angles are possible. Further, the magnetic junction 200 is shown as having a circular footprint. In other embodiments, however, the footprint of the magnetic junction 200 may have another shape including but not limited to an ellipse, a square and a rectangle. The free layer 210 is depicted as a simple layer having magnetic moment 211. In other embodiments, the magnetic moment 211 and may have another orientation. In addition, the free layer 210 may be a synthetic antiferromagnetic layer or other multilayer.

The reference layer 230 is a synthetic antiferromagnet (SAF). The SAF layer 230 thus includes two ferromagnetic layers 232 and 236 separated by a nonmagnetic layer 234, such as Ru. The ferromagnetic layers 232 and 236 have magnetic moments 231 and 233, respectively, that are antiferromagnetically coupled.

The magnetic junction 200 may share the benefits of the magnetic junctions 100, 100', 100", 100''', 100'''' and/or 100'''''. In particular, the magnetic junction 200 may be scalable to higher areal densities. For example, the magnetic junction 200 may have acceptable performance and thermal stability at a diameter of less than ten nanometers. Further, the magnetic junction 200 may have a better controlled resistance area product (RA). In addition, the magnetic junction 200 may have the stray fields due to the reference layer 230 canceled. As can be seen from the flux lines drawn at the top of the magnetic junction 200, the fields from the ferromagnetic layers 232 and 236 substantially cancel. Thus, the stability of the magnetic junction 200 may be enhanced. Consequently, the magnetic junction 200 may have improved performance.

Figure 12:
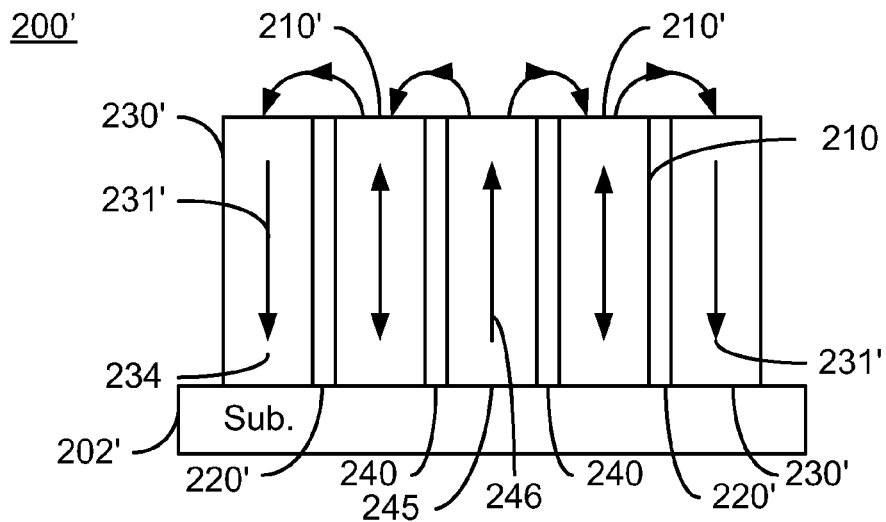
FIGS. 12-13 depict another exemplary embodiment of a vertical magnetic junction switchable using spin transfer.
Figure 13:
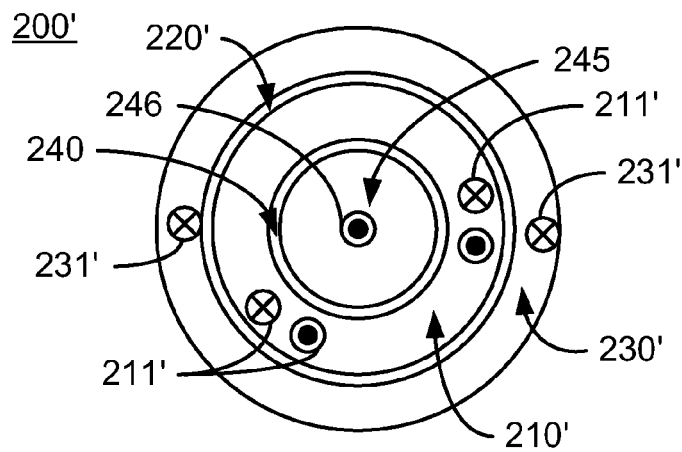

FIGS. 12-13 depict side and plan views of another exemplary embodiment of a vertical magnetic junction 200' switchable using spin transfer. For clarity, FIGS. 12-13 are not to scale. The magnetic junction 200' is analogous to the magnetic junctions 100, 100', 100", 100''', 100'''', 100''''' and 200. Thus, analogous layers are labeled similarly. The magnetic junction 200' includes a free layer 210', a nonmagnetic spacer layer 220', and a reference layer 230' analogous to the layers 210, 220, and 230, respectively. Although layers 210', 220', and 230' are shown with a particular orientation, this orientation may vary in other embodiments. In some embodiments, an optional seed layer (not shown), an optional pinning layer (not shown) and/or optional capping layer (not shown) may be included. The magnetization of the free layer 210' is switchable utilizing spin transfer torque. The magnetic junction 210' is a vertical magnetic junction. Thus, the layers 210', 220' and 230' are at a nonzero angle with respect to the substrate 202'. In the embodiment shown, the layers 210', 220' and 230' are substantially perpendicular to the substrate 202'. However, in other embodiments, other nonzero angles are possible. Further, the magnetic junction 200' is shown as having a circular footprint. In other embodiments, however, the footprint of the magnetic junction 200' may have another shape including but not limited to an ellipse, a square and a rectangle. The free layer 210' and reference layer 230' are depicted as a simple layer having magnetic moment 211' and 231'. In other embodiments, the magnetic moments 211' and 231' may have another orientation. In addition, the free layer 210' and/or the reference layer 230' may be a synthetic antiferromagnetic layer or other multilayer.

The magnetic junction 200' also includes an additional nonmagnetic spacer layer 240 and an additional reference layer 245 having magnetic moment 246. Thus, the free layer 230' is between the nonmagnetic spacer layers 220' and 240 and between the reference layers 230' and 245. The magnetic moments 231' and 246 are aligned antiparallel and, therefore, in the dual state.

The magnetic junction 200' may share the benefits of the magnetic junctions 100, 100', 100", 100''', 100'''', 100''''' and/or 200. In particular, the magnetic junction 200' may be scalable to higher areal densities. For example, the magnetic junction 200' may have acceptable performance and thermal stability at a diameter of less than ten nanometers. Further, the magnetic junction 200' may have a better controlled resistance area product (RA). In addition, the magnetic junction 200' may have reduced stray fields. The two reference layers 230' and 245 have magnetic moments 231' and 246 aligned antiparallel. As can be seen from the flux lines drawn at the top of the magnetic junction 200', the fields from the reference layers 230' and 245 substantially cancel at the free layer 210'. The stability of the magnetic junction 200' may be enhanced. Consequently, the magnetic junction 200' may have improved performance.

Figure 14:
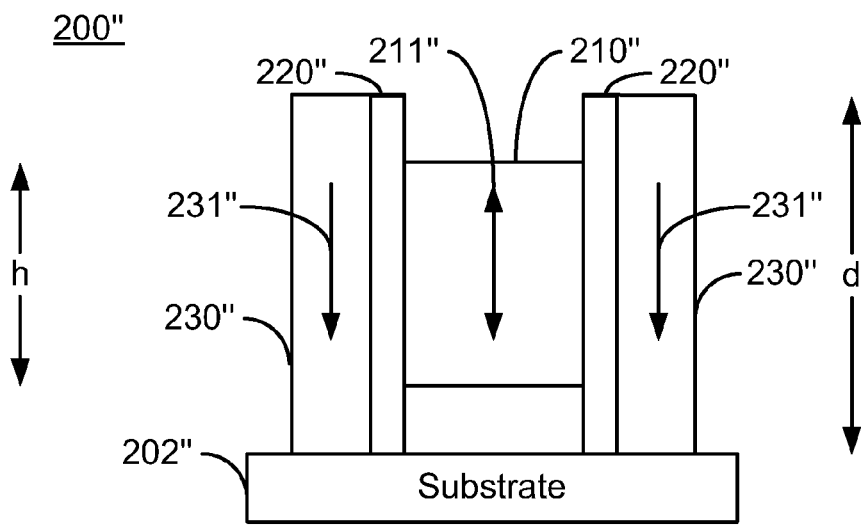
FIG. 14 depicts another exemplary embodiment of a vertical magnetic junction switchable using spin transfer.

FIG. 14 depicts a side view of another exemplary embodiment of a vertical magnetic junction 200" switchable using spin transfer. For clarity, FIG. 14 is not to scale. The magnetic junction 200" is analogous to the magnetic junctions 100, 100', 100", 100''', 100'''', 100''''', 200 and/or 200'. Thus, analogous layers are labeled similarly. The magnetic junction 200" includes a free layer 210", a nonmagnetic spacer layer 220", and a reference layer 230" analogous to the layers 210/210', 220/220', and 230/230', respectively. Although layers 210", 220", and 230" are shown with a particular orientation, this orientation may vary in other embodiments. In some embodiments, an optional seed layer (not shown), an optional pinning layer (not shown) and/or optional capping layer (not shown) may be included. The magnetization of the free layer 210" is switchable utilizing spin transfer torque. The magnetic junction 210" is a vertical magnetic junction. Thus, the layers 210", 220" and 230" are at a nonzero angle with respect to the substrate 202". In the embodiment shown, the layers 210", 220" and 230" are substantially perpendicular to the substrate 202". However, in other embodiments, other nonzero angles are possible. The free layer 210" and reference layer 230" are depicted as a simple layer having magnetic moment 211" and 231". In other embodiments, the magnetic moments 211" and 231" may have another orientation. In addition, the free layer 210" and/or the reference layer 230" may be a synthetic antiferromagnetic layer or other multilayer.

Improved flux closure may be provided in the magnetic junction 200" through the use of the heights of the free layer 210" and the reference layer 230". As can be seen in FIG. 14, the height, h, of the free layer 210" is less than the height, d, of the reference layer 230". In addition, the top and bottom surfaces of the free layer 210" are offset from the top and bottom surfaces, respectively, of the reference layer 230". This difference in height and positions of the top and bottom surfaces reduces the effect of the magnetic charges on the top and bottom surfaces of the reference layer 230". Thus, the cancellation of stray fields may be improved.

The magnetic junction 200" may share the benefits of the magnetic junctions 100, 100', 100", 100''', 100'''', 100''''', 200 and/or 200'. In particular, the magnetic junction 200" may be scalable to higher areal densities. For example, the magnetic junction 200" may have acceptable performance and thermal stability at a diameter of less than ten nanometers. Further, the magnetic junction 200" may have a better controlled resistance area product (RA). In addition, the magnetic junction 200" may have reduced stray fields. The difference in top and bottom surfaces of the free layer 210" and the reference layer 230" reduce the effect of the stray fields on the free layer 230". The stability of the magnetic junction 200" may be enhanced. Consequently, the magnetic junction 200" may have improved performance.

Figure 15:
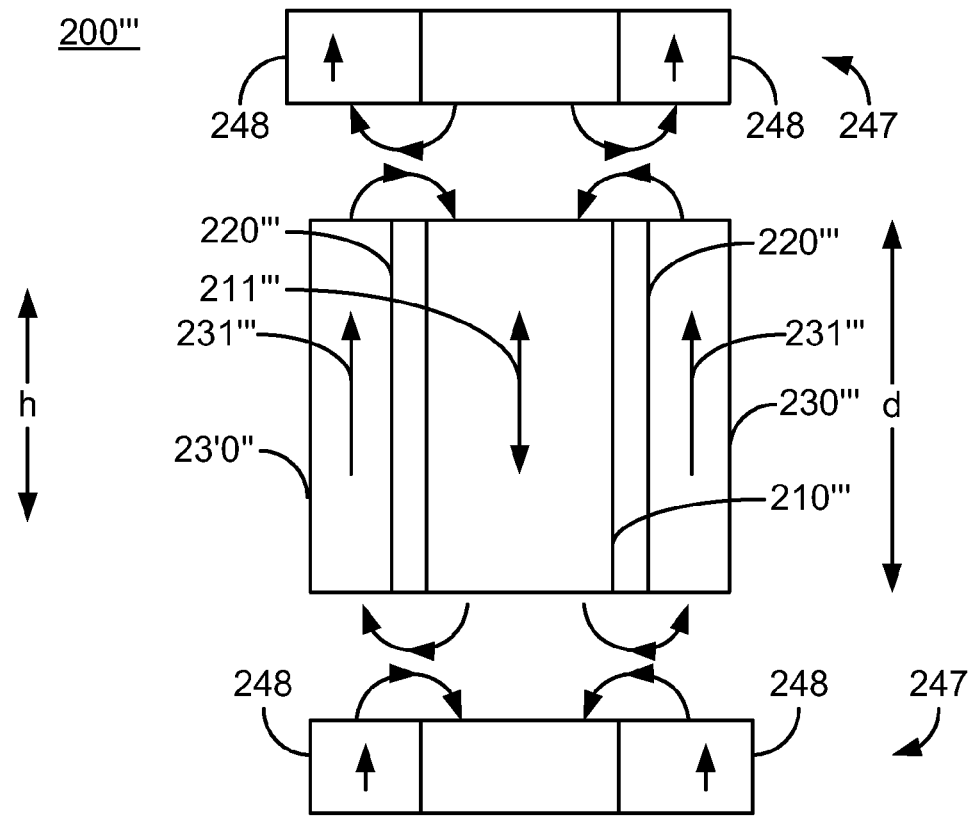
FIG. 15 depicts another exemplary embodiment of a vertical magnetic junction switchable using spin transfer.

FIG. 15 depicts a side view of another exemplary embodiment of a vertical magnetic junction 200''' switchable using spin transfer. For clarity, FIG. 15 is not to scale. The magnetic junction 200''' is analogous to the magnetic junctions 100, 100', 100", 100''', 100'''', 100''''', 200, 200' and/or 200". Thus, analogous layers are labeled similarly. The magnetic junction 200''' includes a free layer 210''', a nonmagnetic spacer layer 220''', and a reference layer 230''' analogous to the layers 210/210'/210", 220/220'/220", and 230/230'/230", respectively. Although layers 210''', 220''', and 230''' are shown with a particular orientation, this orientation may vary in other embodiments. For example, the reference layer 230''' may be centrally located, while the free layer 210''' is at the perimeter. In some embodiments, an optional seed layer (not shown), an optional pinning layer (not shown) and/or optional capping layer (not shown) may be included. The magnetization of the free layer 210''' is switchable utilizing spin transfer torque. The magnetic junction 210''' is a vertical magnetic junction. Thus, the layers 210''', 220''' and 230''' are at a nonzero angle with respect to the substrate (not shown in FIG. 15). In the embodiment shown, the layers 210''', 220''' and 230''' are substantially perpendicular to the substrate. However, in other embodiments, other nonzero angles are possible. The free layer 210''' and reference layer 230''' are depicted as a simple layer having magnetic moment 211''' and 231'''. In other embodiments, the magnetic moments 211''' and 231''' may have another orientation. In addition, the free layer 210''' and/or the reference layer 230''' may be a synthetic antiferromagnetic layer or other multilayer.

The magnetic junction 200''' also includes associated magnetic bias structures 247. In the embodiment shown, two magnetic bias structures 247 are shown. In another embodiment, another number of magnetic bias structures 247 may be used. The magnetic bias structures 247 include magnetic regions 248 that are pinned in the same direction as the reference layer magnetic moment 231'''. The magnetic bias structures are also located in proximity to the top and/or bottom surfaces of the magnetic junction 200'''. Thus, the as can be seen by the flux lines drawn at the top and bottom of the magnetic junction 200''', the cancellation of stray fields may be improved.

The magnetic junction 200''' may share the benefits of the magnetic junctions 100, 100', 100", 100''', 100'''', 100''''', 200, 200' and/or 200". In particular, the magnetic junction 200''' may be scalable to higher areal densities and may have a better controlled resistance area product (RA). In addition, the magnetic junction 200''' may have reduced stray fields. The magnetic bias structures 247 above and below the free layer 210''' reduce the effect of the stray fields on the free layer 230". The stability of the magnetic junction 200''' may be enhanced. Consequently, the magnetic junction 200''' may have improved performance.

Figure 16:
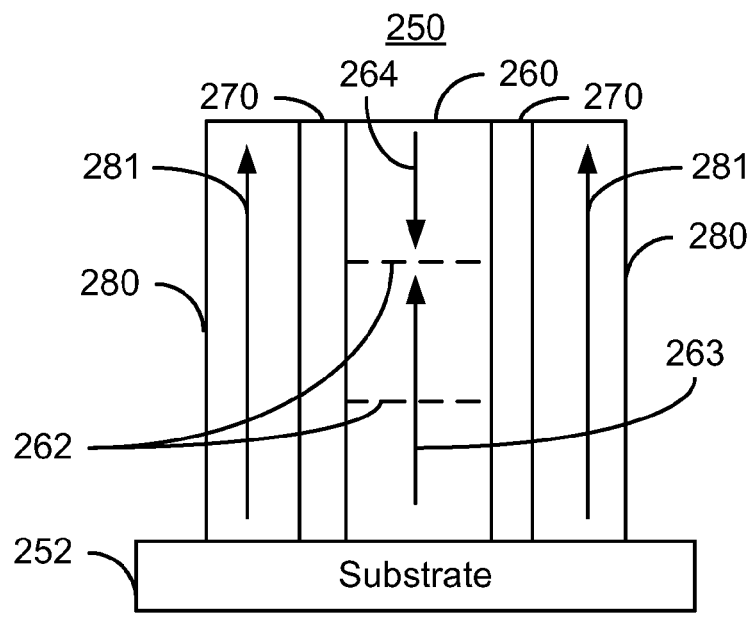
FIGS. 16-17 depict another exemplary embodiment of a vertical magnetic junction switchable using spin transfer and domain wall motion.
Figure 17:
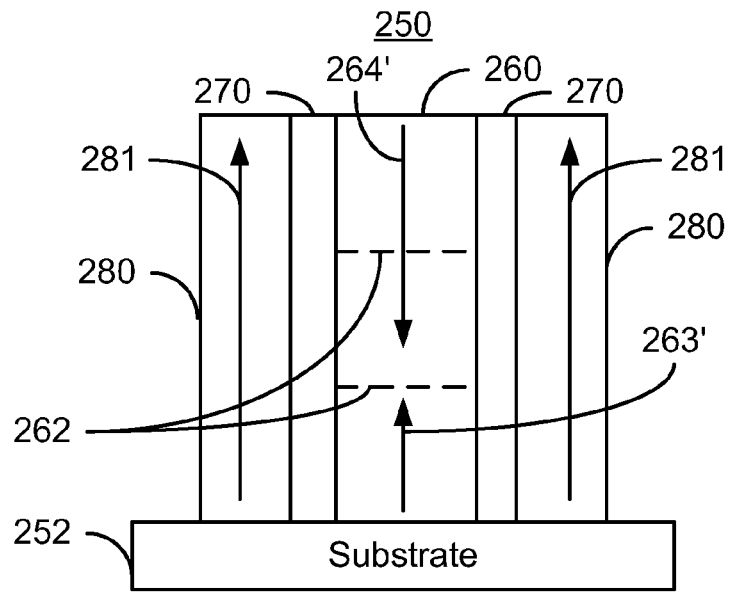

FIGS. 16-17 depict side views of another exemplary embodiment of a vertical magnetic junction 250 switchable using spin transfer. For clarity, FIGS. 16-17 are not to scale. The magnetic junction 250 is analogous to the magnetic junctions 100, 100', 100", 100''', 100'''', 100''''', 200, 200', 200" and/or 200'''. Thus, analogous layers are labeled similarly. The magnetic junction 250 includes a free layer 260, a nonmagnetic spacer layer 270, and a reference layer 280 analogous to the layers 110/110'/110"/110'''/110''''/110'''''/210/210'/210"/210''', 120/120'/120"/120'''/120''''/120'''''/220/220'/220"/220''', and 130/130'/130"/130'''/130''''/130'''''/230/230'/230"/230''', respectively. Although layers 260, 270, and 280 are shown with a particular orientation, this orientation may vary in other embodiments. For example, the reference layer 280 may be at the center of the magnetic junction 250, while the free layer 260 is at the perimeter. In some embodiments, an optional seed layer (not shown), an optional pinning layer (not shown) and/or optional capping layer (not shown) may be included. The magnetization of the free layer 260 is switchable utilizing spin transfer torque and, as discussed below, domain wall motion. The magnetic junction 250 is a vertical magnetic junction. Thus, the layers 260, 270 and 280 are at a nonzero angle with respect to the substrate 252. In the embodiment shown, the layers 260, 270 and 280 are substantially perpendicular to the substrate 252. However, in other embodiments, other nonzero angles are possible. Further, the magnetic junction 250 may have a footprint that is circular footprint. In other embodiments, however, the footprint of the magnetic junction 250 may have another shape including but not limited to an ellipse, a square and a rectangle. The free layer 260 and reference layer 280 are depicted as simple layers. In addition, the free layer 260 and/or the reference layer 280 may be a synthetic antiferromagnetic layer or other multilayer.

The free layer 260 is configured to have multiple domains and at least one domain wall at all times. In some embodiments, this is achieved by including barriers to domain wall motion in the free layer 260. In the embodiment shown, two domain wall motion barriers 262. Thus, the free layer has two domains corresponding to magnetic moments 263 and 264. In other embodiments, more domain wall motion barriers and, therefore, more domains may be present. The domain wall motion barriers 262 barriers may take the form of geometric barriers, such as notches (not shown) in the free layer 260. Insertion layers may also be used to form domain wall motion barriers. For example, a magnetic material that is different than the remainder of the free layer 260 or a thin nonmagnetic layer may be used for the domain wall motion barriers 262. Such magnetic materials may have a smaller exchange coupling or different $M_s$ values than the remainder of the free layer 260. For example, the smaller exchange coupling may be obtained by using a different material in the region of the domain wall motion barriers 262, alloying the material used in the remainder free layer 260 with another magnetic or nonmagnetic material in the region of the domain wall motion barriers 262, or in another manner. Similarly, a different $M_s$ may be obtained through the use of other materials and/or alloys. In other embodiments, a combination of geometric barriers, insertion layers, and/or other mechanisms may be used.

Because of the presence of the domain wall motion barriers 262, the free layer 260 is magnetically stable with a domain wall at either of the barriers 262. In the embodiment shown in FIG. 16, the domain wall resides at the upper barrier 262. If the free layer 260 is to be switched to another state, then a CPP write current (horizontal in FIG. 16) or CIP (vertically in FIG. 16) write current may be applied. Through spin transfer torque and, in some embodiments, an additional magnetic field, the domain wall is moved. Thus, as is shown in FIG. 17, the domain wall has moved to the lower barrier 262. Thus, the free layer 260 includes domains corresponding to the magnetic moment 263' and 264'. This change in the location of the domain wall may be reflected in the resistance of the magnetic junction 250.

The magnetic junction 250 may share the benefits of the magnetic junctions 100, 100', 100'', 100''', 100'''', 100''''', 200, 200', 200'' and/or 200'''. In particular, the magnetic junction 250 may be scalable to higher areal densities. For example, the magnetic junction 250 may have acceptable performance and thermal stability at a diameter of less than ten nanometers. Further, the magnetic junction 250 may have a better controlled resistance area product (RA). Further, movement of domain walls may be a more efficient mechanism for magnetization reversal than for a single domain free layer. Thus, the magnetic junction 250 may have improved switching efficiency. Consequently, the magnetic junction 250 may have improved performance. Note, however, that writing should be carried out such that the free layer 260 remains a multi-domain layer. Further, the magnetoresistance and, therefore, the signal, from the magnetic junction 250 may be reduced.

Figure 18:
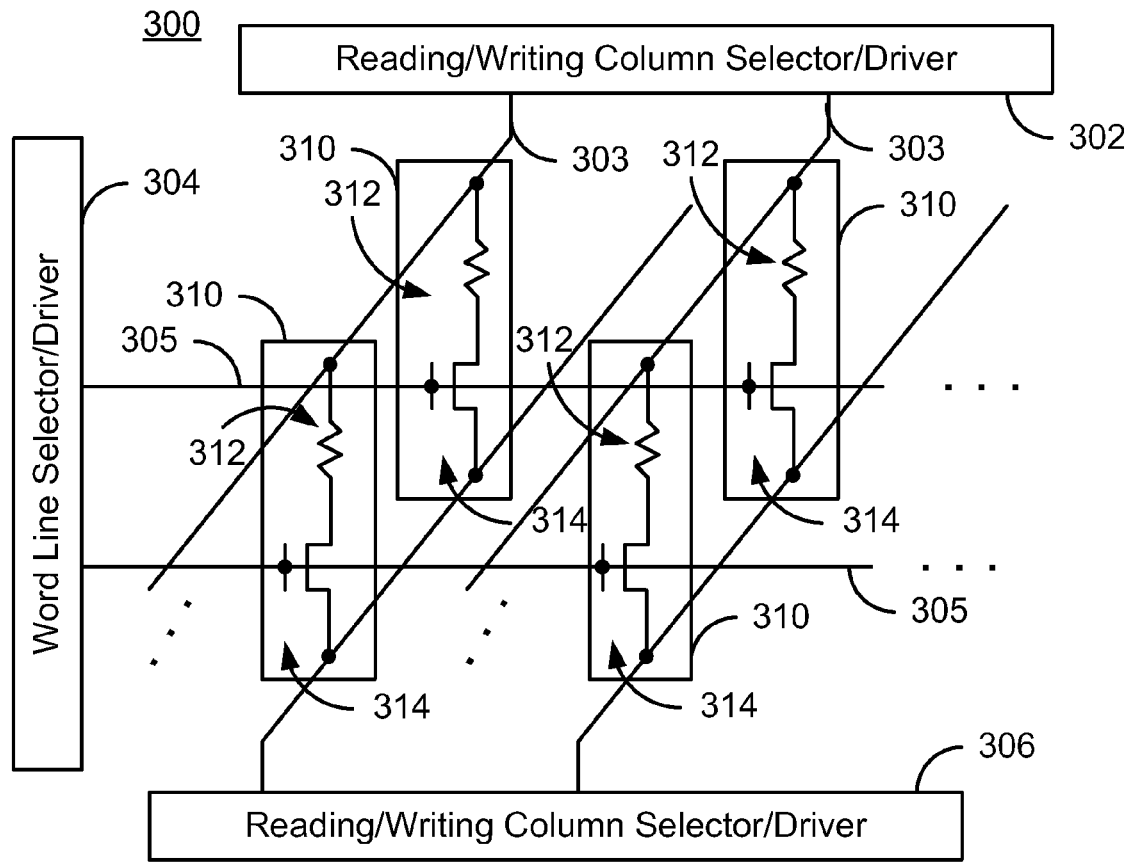
FIG. 18 depicts an exemplary embodiment of a memory utilizing magnetic junctions in the memory element(s) of the storage cell(s).

The vertical magnetic junctions 100, 100', 100'', 100''', 100'''', 100''''', 200, 200', 200'', 200''' and/or 250 may be used in a magnetic memory. FIG. 18 depicts an exemplary embodiment of one such memory 300. The magnetic memory 300 includes reading/writing column select drivers 302 and 306 as well as word line select driver 304. Note that other and/or different components may be provided. The storage region of the memory 300 includes magnetic storage cells 310. Each magnetic storage cell includes at least one magnetic junction 312 and at least one selection device 314. In some embodiments, the selection device 314 is a transistor. The magnetic junctions 312 may include one or more of the magnetic junctions 100, 100', 100'', 100''', 100'''', 100''''', 200, 200', 200'', 200''' and/or 250. Although one magnetic junction 312 is shown per cell 310, in other embodiments, another number of magnetic junctions 312 may be provided per cell.

Because the magnetic memory 300 utilizes the magnetic junctions 100, 100', 100'', 100''', 100'''', 100''''', 200, 200', 200'', 200''' and/or 250, performance may be improved and the magnetic memory 300 may be scaled to higher areal densities. In particular, smaller magnetic junctions 310 may be used while maintaining thermal stability of the memory 300.

Figure 19:
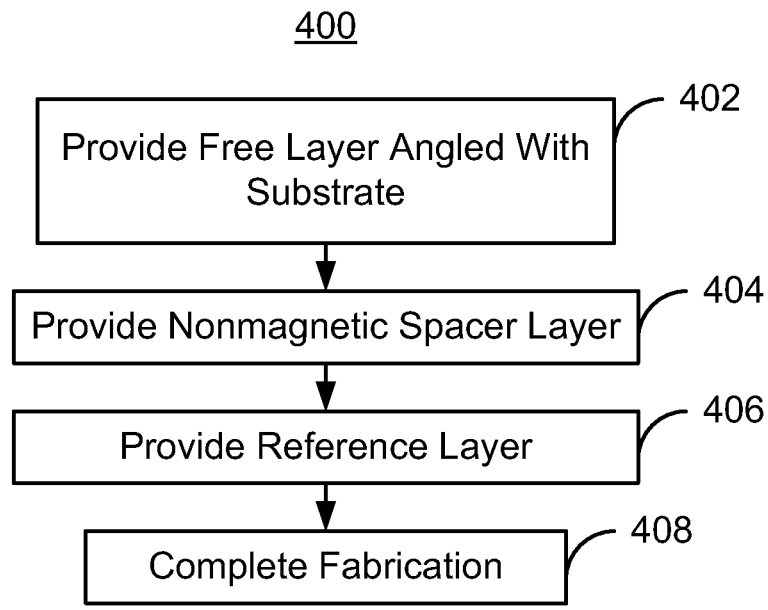
FIG. 19 is a flow chart depicting an exemplary embodiment of a method for fabricating a vertical magnetic junction switchable using spin transfer.

FIG. 19 is a flow chart depicting an exemplary embodiment of a method 400 for fabricating a vertical magnetic junction switchable using spin transfer. The method 400 may thus be used in fabricating one or more of the magnetic junctions 100, 100', 100'', 100''', 100'''', 100''''', 200, 200', 200'', 200''' and/or 250. The method 400 is described in the context of the magnetic junction 100. However, the method 400 may be used on other magnetic junctions. Further, the method 400 may be incorporated into fabrication of magnetic memories. Thus the method 400 may be used in manufacturing a STT-MRAM 300 or other magnetic memory. The method 400 may also include providing optional seed layer(s), optional capping layer(s) and optional pinning layer (not shown). For simplicity, some steps may be omitted. Further, the steps of the method 400 may be combined, performed in another order and/or interleaved. In addition, although the method 400 is described in the context of forming a single magnetic junction, in general multiple magnetic junctions are formed in parallel.

The free layer 110 forming a nonzero angle with the substrate 202 is provided, via step 402. Step 402 may include depositing the desired materials at the desired thickness of the free layer 110. Step 402 may include providing a SAF or other multilayer. In some embodiments, step 402 may include providing the free layer 110 as a pillar structure. This pillar structure may be formed on an underlying contact or may have a contact formed on top of the pillar structure later in fabrication. In some embodiments, the free layer formed in step 402 may be a ring structure.

The nonmagnetic layer 120 is provided, via step 404. Step 404 may include depositing the desired nonmagnetic materials, including but not limited to crystalline MgO. Other processing may also be part of step 204. For example, metallic Mg may be deposited then naturally or plasma oxidized to form a crystalline MgO barrier layer. In addition, the desired thickness of material may be deposited in step 404. For example, step 404 may include providing crystalline MgO that is thin enough to function as a tunneling barrier. The reference layer 130 is provided, via step 406. Step 406 may include depositing the desired materials at the desired thickness of the reference layer 130. Further, step 406 may include providing a SAF. In some embodiments, step 406 may be carried out by forming the reference layer 130 as a ring structure. In other embodiments, the reference layer 130 may be at the center of the magnetic junction being formed. In some such embodiments, step 406 may be performed before steps 402 and 404.

Fabrication of the magnetic junction 100 may then be completed, via step 408. For example, if the magnetic junction being formed is a dual structure, the remaining nonmagnetic spacer layer and reference layer may be formed in step 408. In addition, the magnetic moments of the reference layer(s) may be set. Further, contacts and other portions of the memory may be manufacture.

In some embodiments, a contact may be formed first and the free layer material deposited as a layer on the contact in step 402. The materials for the nonmagnetic spacer layer 120 and reference layer 130 are also deposited as part of steps 404 and 406. Later in fabrication, portions of the free layer material, nonmagnetic spacer layer material and reference layer material may be removed from the top of the contact and a region adjacent to the contact. Thus, the free layer 110, nonmagnetic spacer layer 120 and reference layer 130 may each be ring structure formed above the surface of the underlying layers. Alternatively, the free layer material may be deposited in a trench and a portion of the free layer material at the base of the trench removed. Similarly, the nonmagnetic spacer layer material may be deposited in a remaining, unfilled portion of the trench. The part of the nonmagnetic spacer layer material at the bottom of the trench is also removed. The reference layer material may then be deposited and the portion at the bottom of the trench removed. Finally, a central contact, if any, may fill the trench. In such an embodiment, an outer contact may be deposited before the free layer is provided. However, in such methods, the portion of the layer at the base of the trench is removed generally removed before deposition of the next layer to reduce the possibility of current shunting or shorting of the junction being formed.

Using the method 400, one or more of the magnetic junctions 100, 100', 100'', 100''', 100'''', 100''''', 200, 200', 200'', 200''' and/or 250, as well as the magnetic memory 300 may be fabricated. Thus the benefits of the magnetic junctions 100, 100', 100'', 100''', 100'''', 100''''', 200, 200', 200'', 200''', 250 and/or 310 may be achieved.

Figure 20:
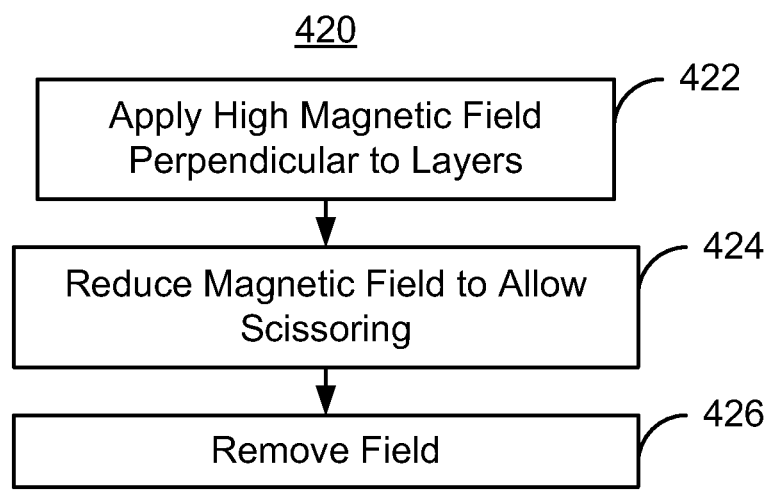
FIG. 20 is a flow chart depicting an exemplary embodiment of a method for setting the reference layers of an exemplary embodiment of a vertical magnetic junction switchable using spin transfer to a dual state.

FIG. 20 is a flow chart depicting an exemplary embodiment of a method 420 for fabricating a vertical magnetic junction switchable using spin transfer. More specifically, the method 420 is used in setting the direction of magnetization of the reference layers in a dual magnetic junction. The method 420 may thus be used in fabricating the magnetic junction 200'. The method 420 is, therefore, described in the context of the magnetic junction 200'. However, the method 420 may be used on other magnetic junctions. Further, the method 420 may be incorporated into fabrication of magnetic memories, such as a STT-MRAM 300 or other magnetic memory. In some embodiments, the steps of the method 420 may be combined, performed in another order and/or interleaved. In some embodiments, the method 420 is performed only if the magnetic moments 231' and 246 are in the anti-dual state (i.e. aligned in a single direction). However, in other embodiments, the method 420 may commence with applying a large field along the easy axis of the reference layers 230' and 245 to align the magnetic moments 231' and 246.

A high field is applied perpendicular to the direction that the magnetic moments 231' and 246 are desired to be pinned, via step 422. The high magnetic field sufficient to align the magnetic moments 231' and 246 along the hard axis.

The magnetic field is then ramped down, via step 424. The magnetic field is reduced slowly enough that the magnetic moments 231' may have time to relax in response to the field. Thus, the time taken to reduce the magnetic field applied in step 422 is greater than or equal to the time constant of the magnetic moments 231' and 246. As a result, the magnetic moments 231' and 246 form a scissor state. The magnetic field is finally removed, via step 426. The magnetic moments 231' and 246' may then relax to the antidual state.

Thus, using the method 420, the reference layers 230' and 245 may be set to the desired state.

Figure 21:
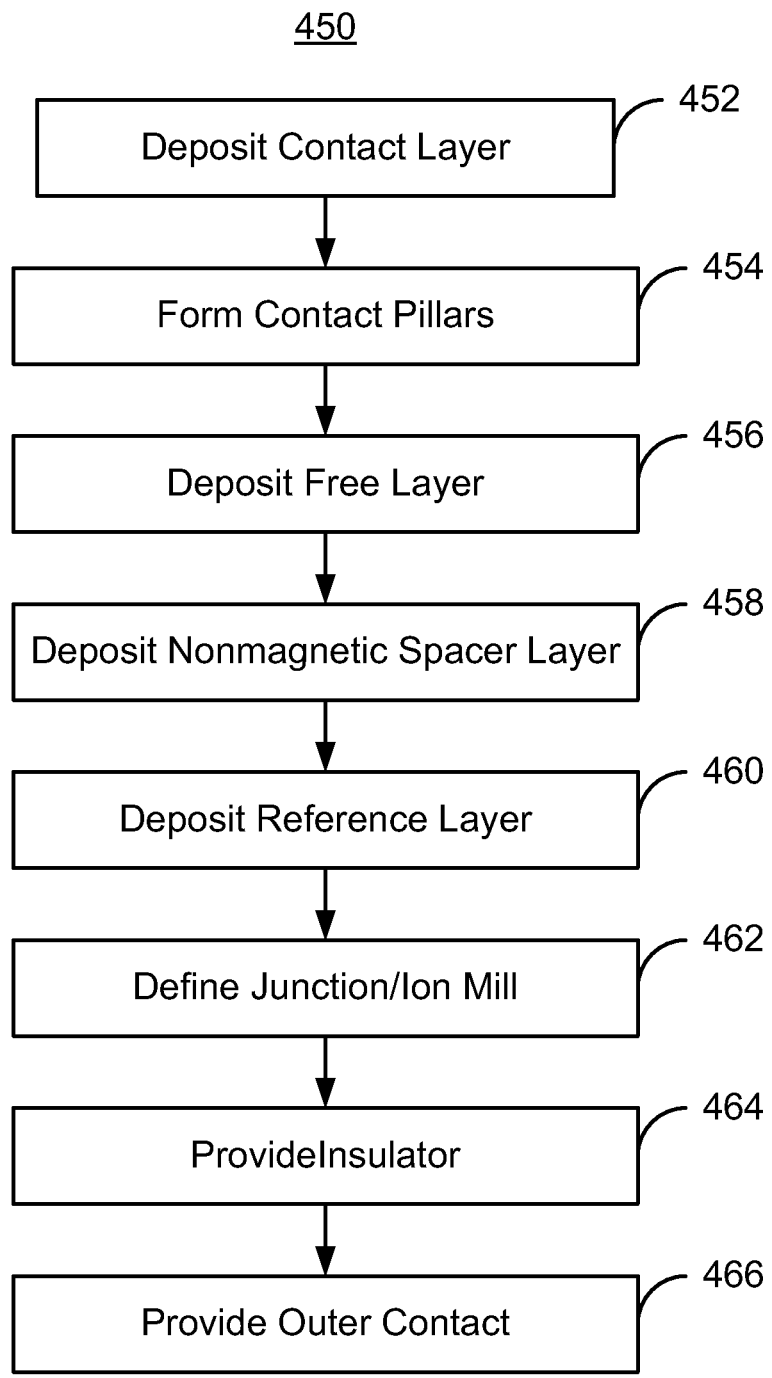
FIG. 21 is a flow chart depicting an exemplary embodiment of a method for fabricating a vertical magnetic junction switchable using spin transfer.
Figure 22:
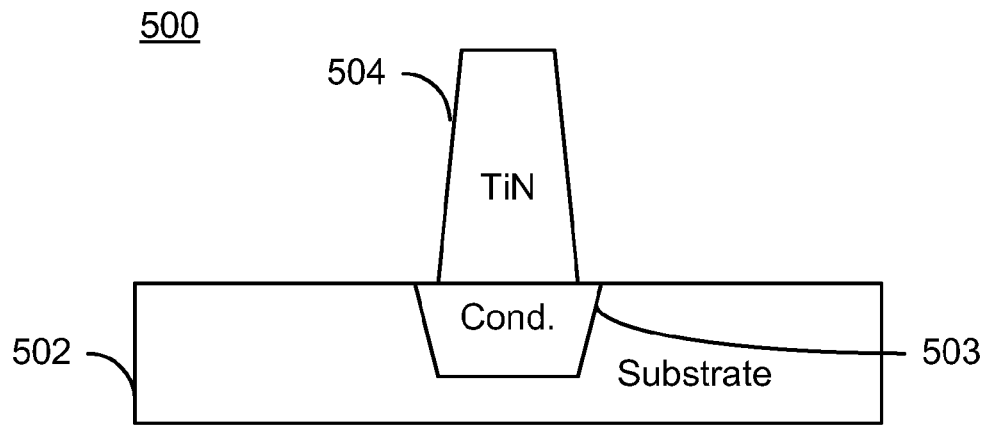
FIGS. 22-26 depict an exemplary embodiment of a vertical magnetic junction during fabrication.
Figure 23:
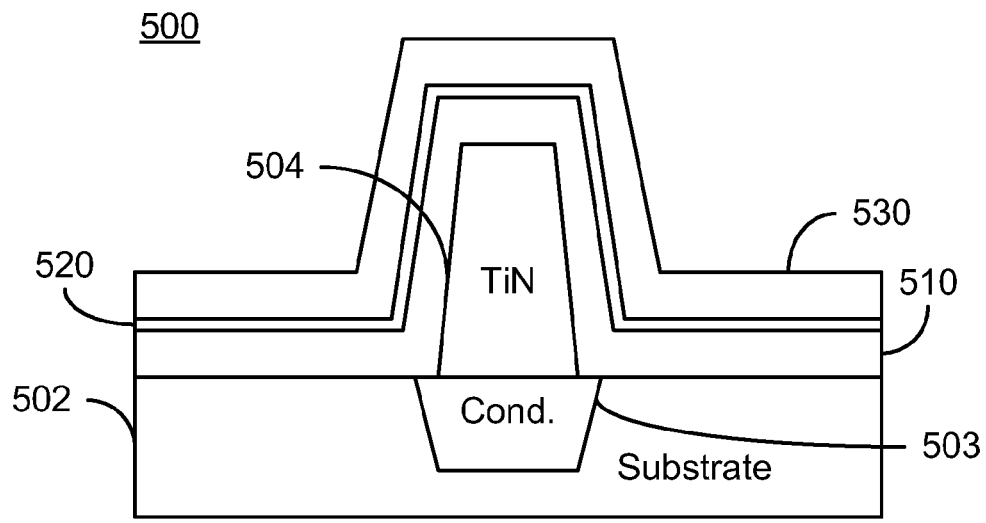
Figure 24:
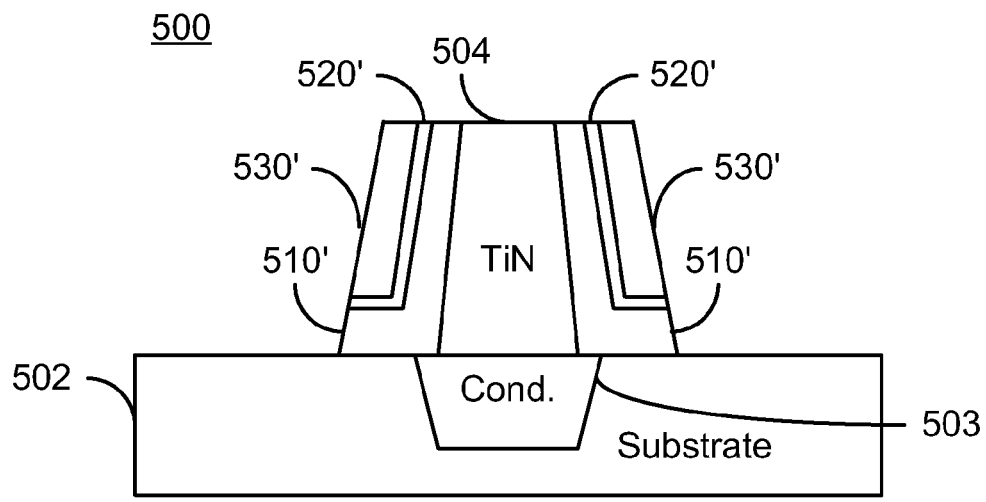

FIG. 21 is a flow chart depicting an exemplary embodiment of a method 450 for fabricating a vertical magnetic junction switchable using spin transfer. The method 450 may thus be used in fabricating one or more of the magnetic junctions 100, 100', 100'', 100''', 100'''', 100''''', 200, 200', 200'', 200''' and/or 250. FIGS. 22-24 depict one embodiment of a vertical magnetic junction 500 during formation using the method 450. For clarity, FIGS. 22-24 are not to scale. The method 450 is described in the context of the magnetic junction 550. However, the method 450 may be used on other magnetic junctions. Further, the method 450 may be incorporated into fabrication of magnetic memories. Thus the method 450 may be used in manufacturing a STT-MRAM 300 or other magnetic memory. The method 450 may also include providing optional seed layer(s), optional capping layer(s) and optional pinning layer (not shown). For simplicity, some steps may be omitted. Further, the steps of the method 450 may be combined, performed in another order and/or interleaved. In addition, although the method 450 is described in the context of forming a single magnetic junction, in general multiple magnetic junctions are formed in parallel. The method 450 is also described in the context of providing a magnetic junction having a central free layer. However, in other embodiments, the method 450 may be adjusted to provide a free layer that is not centrally located. Further, the method 450 is described in the context of fabricating a magnetic junction that is to have a CPP current. The method 450 can, however, be adapted for a magnetic junction utilizing a CIP current.

A contact layer is deposited, via step 452. A contact pillar for the magnetic junctions is formed from the contact layer, via step 454. In some embodiments, a full film of a conductive material that may be reactive ion etched, such as TiN, and/or W, is deposited in step 452. A mask covering the regions at which a contact is to be formed is then provided and exposed portions of the contact layer removed, for example using a reactive ion etch. In other embodiments, a mask having apertures in the regions in which the contacts are to be formed may be provided. The conductive material deposited, and the mask removed. Thus, central contacts are formed. FIG. 22 depicts the magnetic junction 500 after steps 452 and 454 have been performed. Thus, a TiN contact 504 has been formed on the substrate 502. In the embodiment shown, the substrate 502 may simply be another layer that was fabricated previously. In addition, conductor 503 is also shown. The conductor 503 may be a line that is used to provide electrical connection to the contact 504.

The free layer material is deposited, via step 456. Step 456 may include depositing multiple layers for a multilayer free layer. In some embodiments, CoFeB may be used for the free layer. The deposition may be carried out using an angled ion beam deposition or sputtering.

The nonmagnetic spacer layer material is deposited, via step 458. In addition, Step 458 may include fabricating a crystalline MgO barrier layer having the desired orientation. In some embodiments, the MgO barrier layer may be sputtered.

The reference layer material is deposited, via step 460. Step 460 may include depositing multiple layers for a multilayer reference layer. In some embodiments, CoFeB may be used for the reference layer. FIG. 23 depicts the magnetic junction 500 after step 460 is performed. Thus, the free layer 510, nonmagnetic spacer layer 520 and reference layer 530 materials are shown.

The magnetic junction 500 is then defined, via step 462. Step 462 includes removing a portion of the free layer, nonmagnetic spacer layer and reference layer materials from the top surface of the pillar contact. In addition, these materials are removed from an area adjacent to the pillar contact. In some embodiments, step 462 is performed using a technique that preferentially removes such materials from flat (horizontal) surfaces. For example, an ion mill carried at in a direction substantially perpendicular to the surface of the substrate 502 may be used. Alternatively, a reactive ion etch may be used. Thus, the magnetic junction 500 is defined. FIG. 24 depicts the magnetic junction 500 after step 462 is performed. Thus, the free layer 510', nonmagnetic spacer layer 520' and reference layer 530' have been formed. Note that the underlying conductor 503 contacts only the central contact 504 and the adjoining layer 510'.

Figure 25:
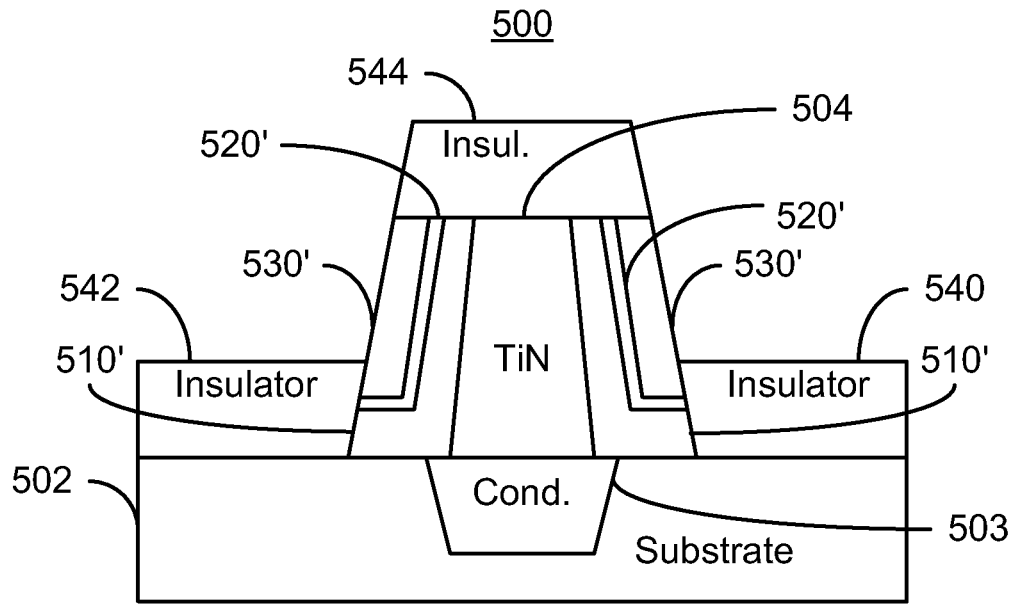

An insulator is provided over the desired regions of the magnetic junction 500, via step 464. Step 464 may include depositing an insulator such as $SiO_2$, SiN, SiO, or aluminum oxide. In addition, undesired portions of the insulator may be removed. The insulator provided in step 464 may prevent shorting of the magnetic junction 500 and prevent contact from being made to the free layer 510' by an outer contact to be formed. FIG. 25 depicts the magnetic junction 500 after step 464 is performed. Thus, insulators 542, 544 and 540 are shown. In some embodiments, the insulators 542, 544 and 540 are all formed from the same layer.

Figure 26:
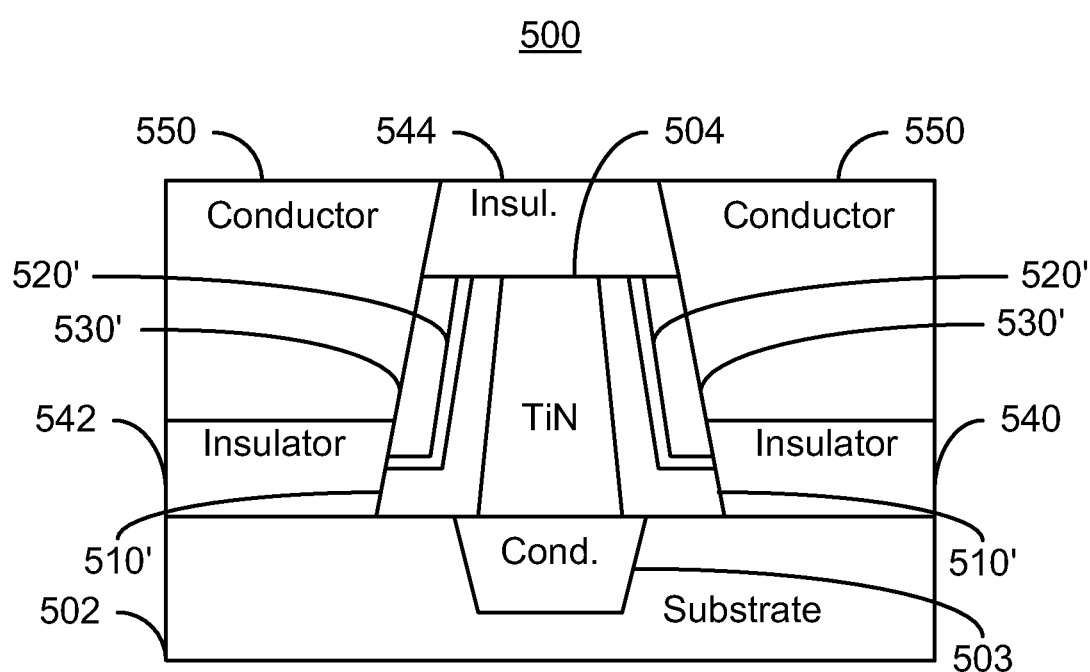

The outer contact is then formed, via step 466. Step 466 may include full film depositing a conductive layer and removing selected portions of the layer. FIG. 26 depicts the magnetic junction 500 after step 466 is performed. Thus, conductor 550 has been formed. As can be seen in FIG. 2, current may flow between the contacts 504 and 550 through the layers 510', 520' and 530'.

A method and system for providing a vertical magnetic junction and a memory using the magnetic junction have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A magnetic junction for use in a magnetic device and residing on a substrate, the magnetic junction comprising:
   a reference layer;
   a nonmagnetic spacer layer;
   a free layer, the nonmagnetic spacer layer residing between the free layer and the reference layer, the free layer, the nonmagnetic spacer layer and the reference layer forming at least one nonzero angle with the substrate, the free layer having a first height in a direction normal to the substrate, the reference layer having a second height in the direction, the first height being less than the second height, the free layer, nonmagnetic spacer layer and reference layer having an orientation selected from a first orientation and a second orientation, in the first orientation the nonmagnetic spacer layer surrounds the free layer and the reference layer surrounds the nonmagnetic spacer layer in a radial direction, in the second orientation the nonmagnetic spacer layer surrounds the reference layer and the free layer surrounds the nonmagnetic spacer layer in a radial direction, the radial direction being measured from a central portion of the magnetic junction, being substantially perpendicular to the first height and being substantially a parallel to the substrate; and
   at least one magnetic bias structure adjacent to the free layer and geometrically and magnetically aligned with the reference layer;
   wherein the magnetic junction is configured such that the free layer is switchable between a plurality of stable magnetic states when a write current is passed through the magnetic junction.

2. The magnetic junction of claim 1 wherein the nonzero angle is greater than forty five degrees.

3. The magnetic junction of claim 1 wherein the free layer, the nonmagnetic spacer layer, and the reference layer are substantially perpendicular to the substrate.

4. The magnetic junction of claim 3 wherein the nonmagnetic spacer layer is substantially perpendicular to the substrate.

5. The magnetic junction of claim 1 wherein the free layer is a pillar having an axis and a plurality of sidewalls substantially perpendicular to the substrate.

6. The magnetic junction of claim 5 wherein the nonmagnetic spacer layer is adjacent to the plurality of sidewalls.

7. The magnetic junction of claim 6 wherein the magnetic junction has a circular cross section.

8. The magnetic junction of claim 6 wherein the magnetic junction has a cross section selected from a circle, an ellipse, a square and a rectangle.

9. The magnetic junction of claim 1 wherein the reference layer is a synthetic antiferromagnetic layer.

10. The magnetic junction of claim 1 wherein the free layer is a synthetic antiferromagnetic layer.

11. The magnetic junction of claim 1 further comprising:
    an additional nonmagnetic spacer layer; and
    an additional reference layer, the free layer being between the nonmagnetic spacer layer and the additional nonmagnetic spacer layer, the additional nonmagnetic spacer layer being between the additional reference layer and the free layer, the additional reference layer and the additional nonmagnetic spacer layer forming at least one additional nonzero angle with the substrate.

12. The magnetic junction of claim 1 wherein the free layer is separated from the substrate by a first distance, the reference layer is separated from the substrate by a second distance, and the first distance is greater than the second distance.

13. A magnetic junction for use in a magnetic device and residing on a substrate, the magnetic junction comprising:
    a reference layer;
    a nonmagnetic spacer layer; and
    a free layer, the nonmagnetic spacer layer residing between the free layer and the reference layer, the free layer, the nonmagnetic spacer layer and the reference layer forming at least one nonzero angle with the substrate, the free layer having a first height in a direction normal to the substrate, the reference layer having a second height in the direction, the first height being less than the second height, the free layer, nonmagnetic spacer layer and reference layer having an orientation selected from a first orientation and a second orientation, in the first orientation the nonmagnetic spacer layer surrounds the free layer and the reference layer surrounds the nonmagnetic spacer layer in a radial direction, in the second orientation the nonmagnetic spacer layer surrounds the reference layer and the free layer surrounds the nonmagnetic spacer layer in a radial direction, the radial direction being measured from a central portion of the magnetic junction, being substantially perpendicular to the first height and being substantially a parallel to the substrate;

at least one magnetic bias structure adjacent to the free layer, the free layer being between a first magnetic bias structure of the at least one magnetic bias structure and the substrate, the at least one magnetic bias structure being geometrically and magnetically aligned with the reference layer; and wherein the magnetic junction is configured such that the free layer is switchable between a plurality of stable magnetic states when a write current is passed through the magnetic junction.

14. The magnetic junction of claim 13 wherein a second magnetic bias structure of the at least one magnetic bias structure is between the free layer and the substrate.

15. The magnetic junction of claim 1 wherein the free layer further includes:
a plurality of domain wall motion barriers such that the free layer includes at least one domain wall, the plurality of stable states including the at least one domain wall residing substantially at at least one of the plurality of domain wall motion barriers.

16. A magnetic junction for use in a magnetic device and residing on a substrate, the magnetic junction comprising:
a reference layer;
a nonmagnetic spacer layer;
a free layer, the nonmagnetic spacer layer residing between the free layer and the reference layer, the free layer, the nonmagnetic spacer layer and the reference layer forming at least one nonzero angle with the substrate, the free layer further including a plurality of domain wall motion barriers such that the free layer includes at least one domain wall, a plurality of stable magnetic states including the at least one domain wall residing substantially at at least one of the plurality of domain wall motion barriers, wherein the plurality of domain wall motion barriers includes an insertion layer residing in the free layer; and
at least one magnetic bias structure being geometrically and magnetically aligned with the reference layer
wherein the magnetic junction is configured such that the free layer is switchable between the plurality of stable magnetic states when a write current is passed through the magnetic junction.

17. A magnetic junction for use in a magnetic device and residing on a substrate, the magnetic junction comprising:
a free layer including at least one cylindrical sidewall substantially perpendicular to the substrate;
a nonmagnetic spacer layer adjacent to the at least one cylindrical sidewall, surrounding the at least one cylindrical sidewall in a radial direction, and having a cylindrical geometry, the nonmagnetic spacer layer being a tunneling barrier layer;
a reference layer, the nonmagnetic spacer layer residing between the free layer and the reference layer, the reference layer having a substantially cylindrical geometry a and surrounding the nonmagnetic spacer layer in the radial direction;
wherein the magnetic junction is configured such that the free layer is switchable between a plurality of stable magnetic states when a write current is passed through the magnetic junction; and
wherein at least one magnetic bias structure is adjacent to the free layer the at least one magnetic bias structure being geometrically and magnetically aligned with the reference layer, and the free layer includes a plurality of domain wall motion barriers such that the free layer includes at least one domain wall;

wherein if the at least one magnetic bias structure is adjacent to the free layer then the free layer is between a first magnetic bias structure of the at least one magnetic bias structure and the substrate; and wherein if the free layer includes a plurality of domain wall motion barriers then the free layer includes at least one domain wall, the plurality of stable states include the at least one domain wall residing substantially at at least one of the plurality of domain wall motion barriers, and the plurality of domain wall motion barriers includes at least one of a shape variation of the free layer and an insertion layer residing in the free layer.

18. The magnetic junction of claim 17 wherein the free layer has a central via therein.

19. The magnetic junction of claim 17 further comprising:
an additional nonmagnetic spacer layer having at least one additional cylindrical sidewall, the free layer being between the nonmagnetic spacer layer and the additional nonmagnetic spacer layer and being adjacent to the at least one additional cylindrical sidewall; and
an additional reference layer, the additional nonmagnetic spacer layer residing between the additional reference layer and the free layer.

20. The magnetic junction of claim 19 wherein the additional reference layer has a central via therein.

21. A magnetic memory comprising:
a substrate having a top surface;
a plurality of magnetic storage cells, each of the plurality of magnetic storage cells including at least one magnetic junction and at least one magnetic bias structure, the at least one magnetic junction including a reference layer, a nonmagnetic spacer layer and a free layer, the nonmagnetic spacer layer residing between the free layer and the reference layer, the free layer, the nonmagnetic spacer layer and the reference layer forming at least one nonzero angle with the substrate, the magnetic junction being configured such that the free layer is switchable between a plurality of stable magnetic states when a write current is passed through the magnetic junction, the free layer having a first height in a direction normal to the substrate, the reference layer having a second height in the direction, the first height being less than the second height, the free layer, nonmagnetic spacer layer and reference layer having an orientation selected from a first orientation and a second orientation, in the first orientation the nonmagnetic spacer layer surrounds the free layer and the reference layer surrounds the nonmagnetic spacer layer in a radial direction, in the second orientation the nonmagnetic spacer layer surrounds the reference layer and the free layer surrounds the nonmagnetic spacer layer in a radial direction, the radial direction being measured from a central portion of the magnetic junction, being substantially perpendicular to the first height and being substantially a parallel to the substrate, the at least one magnetic bias structure being adjacent to the free layer and geometrically and magnetically aligned with the reference layer; and
a plurality of bit lines;
wherein the free layer has a first height in a direction normal to the substrate, the reference layer has a second height in the direction and the first height is less than the second height.

22. The magnetic memory of claim 21 wherein the nonzero angle is greater than forty five degrees.

23. The magnetic memory of claim 21 wherein the free layer, the nonmagnetic spacer layer and the reference layer are substantially perpendicular to the substrate.

24. The magnetic memory of claim 21 wherein the free layer is a pillar having an axis and a plurality of sidewalls substantially perpendicular to the substrate.

25. The magnetic memory of claim 24 wherein the nonmagnetic spacer layer is adjacent to the plurality of sidewalls.

26. The magnetic memory of claim 25 wherein the magnetic junction has a circular cross section.

27. The magnetic memory of claim 21 wherein the magnetic junction has a cross section selected from a circle, an ellipse, a square and a rectangle.

28. The magnetic memory of claim 21 wherein the reference layer is a synthetic antiferromagnetic layer.

29. The magnetic memory of claim 21 wherein each of the at least one magnetic junction further includes:
an additional nonmagnetic spacer layer; and
an additional reference layer, the free layer being between the nonmagnetic spacer layer and the additional nonmagnetic spacer layer, the additional nonmagnetic spacer layer being between the additional reference layer and the free layer, the additional reference layer and the additional nonmagnetic spacer layer forming at least one additional nonzero angle with the substrate.

30. A magnetic memory comprising:
a substrate having a top surface;
a plurality of magnetic storage cells, each of the plurality of magnetic storage cells including at least one magnetic junction and at least one magnetic bias structure, the at least one magnetic junction including a reference layer, a nonmagnetic spacer layer and a free layer, the nonmagnetic spacer layer residing between the free layer and the reference layer, the free layer, the nonmagnetic spacer layer and the reference layer forming at least one nonzero angle with the substrate, the magnetic junction being configured such that the free layer is switchable between a plurality of stable magnetic states when a write current is passed through the magnetic junction, the free layer being separated from the substrate by a first distance, the reference layer being separated from the substrate by a second distance, and the first distance being greater than the second distance, the free layer, nonmagnetic spacer layer and reference layer having an orientation selected from a first orientation and a second orientation, in the first orientation the nonmagnetic spacer layer surrounds the free layer and the reference layer surrounds the nonmagnetic spacer layer in a radial direction, in the second orientation the nonmagnetic spacer layer surrounds the reference layer and the free layer surrounds the nonmagnetic spacer layer in a radial direction, the radial direction being measured from a central portion of the magnetic junction, being substantially perpendicular to the first height and being substantially a parallel to the substrate, the at least one magnetic bias structure being adjacent to the free layer and geometrically and magnetically aligned with the reference layer; and
a plurality of bit lines.

31. The magnetic memory of claim 21 wherein the at least one magnetic junction further includes:
at least one magnetic bias structure adjacent to the free layer.

32. A magnetic memory comprising:
a substrate having a top surface;
a plurality of magnetic storage cells, each of the plurality of magnetic storage cells including at least one magnetic junction and at least one magnetic bias structure, the at least one magnetic junction including a reference layer, a nonmagnetic spacer layer, a free layer and at least one magnetic bias structure adjacent to the free layer, the nonmagnetic spacer layer residing between the free layer and the reference layer, the free layer, the nonmagnetic spacer layer and the reference layer forming at least one nonzero angle with the substrate, the magnetic junction being configured such that the free layer is switchable between a plurality of stable magnetic states when a write current is passed through the magnetic junction, the free layer being between a first magnetic bias structure of the at least one magnetic bias structure and the substrate, the free layer having a first height in a direction normal to the substrate, the reference layer having a second height in the direction, the first height being less than the second height, the free layer, nonmagnetic spacer layer and reference layer having an orientation selected from a first orientation and a second orientation, in the first orientation the nonmagnetic spacer layer surrounds the free layer and the reference layer surrounds the nonmagnetic spacer layer in a radial direction, in the second orientation the nonmagnetic spacer layer surrounds the reference layer and the free layer surrounds the nonmagnetic spacer layer in a radial direction, the radial direction being measured from a central portion of the magnetic junction, being substantially perpendicular to the first height and being substantially a parallel to the substrate, the at least one magnetic bias structure being adjacent to the free layer and geometrically and magnetically aligned with the reference layer; and
a plurality of bit lines.

33. The memory of claim 32 wherein a second magnetic bias structure of the at least one magnetic bias structure is between the free layer and the substrate.

34. The magnetic memory of claim 21 wherein the free layer further includes:
a plurality of domain wall motion barriers such that the free layer includes at least one domain wall, the plurality of stable states including the at least one domain wall residing substantially at at least one of the plurality of domain wall motion barriers.

35. A magnetic memory comprising:
a substrate having a top surface;
a plurality of magnetic storage cells, each of the plurality of magnetic storage cells including at least one magnetic junction and at least one magnetic bias structure, the at least one magnetic junction including a reference layer, a nonmagnetic spacer layer and a free layer, the nonmagnetic spacer layer residing between the free layer and the reference layer, the free layer, the nonmagnetic spacer layer and the reference layer forming at least one nonzero angle with the substrate, the magnetic junction being configured such that the free layer is switchable between a plurality of stable magnetic states when a write current is passed through the magnetic junction, the at least one magnetic bias structure being adjacent to the free layer and geometrically and magnetically aligned with the reference layer; and
a plurality of bit lines;
wherein the plurality of domain wall motion barriers includes an insertion layer residing in the free layer.

36. The magnetic memory of claim 21 wherein the free layer is a synthetic antiferromagnetic layer.

37. A method for providing a magnetic junction on a substrate for use in a magnetic device comprising:
providing a free layer, step of providing the free layer further including defining a first height of the free layer in a direction normal to the substrate;
providing a nonmagnetic spacer layer;
providing a reference layer, the nonmagnetic spacer layer residing between the free layer and the reference layer, the free layer, the nonmagnetic spacer layer and the reference layer forming at least one nonzero angle with the substrate, the step of providing the reference layer further including defining a second height of the reference layer in the direction, the first height being less than the second height;
wherein the magnetic junction is configured such that the free layer is switchable between a plurality of stable magnetic states when a write current is passed through the magnetic junction, the free layer, nonmagnetic spacer layer and reference layer having an orientation selected from a first orientation and a second orientation, in the first orientation the nonmagnetic spacer layer surrounds the free layer and the reference layer surrounds the nonmagnetic spacer layer in a radial direction, in the second orientation the nonmagnetic spacer layer surrounds the reference layer and the free layer surrounds the nonmagnetic spacer layer in a radial direction, the radial direction being measured from a central portion of the magnetic junction, being substantially perpendicular to the first height and being substantially a parallel to the substrate; and
providing at least one magnetic bias structure adjacent to the free layer and geometrically and magnetically aligned with the reference layer.

38. The method of claim 37 wherein the nonzero angle is greater than forty five degrees.

39. The method of claim 37 wherein the free layer, the nonmagnetic spacer layer and the reference layer are substantially perpendicular to the substrate.

40. The method of claim 37 wherein the step of providing the free layer further includes:
providing a pillar contact; and
depositing at least one free layer material on the pillar contact;
wherein the step of providing the nonmagnetic spacer layer further includes depositing at least one nonmagnetic spacer layer material on the at least one free layer material; and
wherein the step of providing the reference layer further includes depositing at least reference layer material on the at least one nonmagnetic spacer layer material.

41. The method of claim 40 wherein the pillar contact includes a top surface, the method further comprising:
removing a portion of the at least one free layer material, a portion of the at least one nonmagnetic spacer layer material and a portion of the at least one reference layer material from the top surface of the pillar contact and an area adjacent to the pillar contact.

42. The method of claim 41 wherein the pillar contact has a cross section selected from a circle, an ellipse, a square and a rectangle.

43. The method of claim 37 further comprising:
providing a trench in the substrate, the trench having a bottom and a plurality of sidewalls, the trench having a cross section selected from a circle, an ellipse, a square and a rectangle:
providing a first contact on the plurality of sidewalls of the trench, the step of providing the first contact further includes depositing a first contact layer in the trench and removing a portion of the first contact layer on the bottom of the trench;
wherein the step of providing the reference layer further includes providing the reference layer on the first contact on the plurality of sidewalls of the trench;
wherein the step of providing the nonmagnetic spacer layer further includes providing the nonmagnetic spacer layer on the reference layer on the plurality of sidewalls of the trench;
wherein the step of providing the free layer further includes providing the free layer on the nonmagnetic spacer layer on the plurality of sidewalls of the trench; and
wherein the method further includes providing a second contact on the free layer, the second contact filling a center portion of the trench.

44. The method of claim 37 wherein the step of providing the reference layer includes:
providing a synthetic antiferromagnetic layer.

45. The method of claim 37 further comprising:
providing an additional nonmagnetic spacer layer; and
providing an additional reference layer, the free layer being between the nonmagnetic spacer layer and the additional nonmagnetic spacer layer, the additional nonmagnetic spacer layer being between the additional reference layer and the free layer, the additional reference layer and the additional nonmagnetic spacer layer forming at least one additional nonzero angle with the substrate.

46. The method of claim 45 further comprising:
setting a magnetic moment of the reference layer and the additional reference layer to an antidual state, the step of setting the magnetic moments further comprising applying a magnetic field substantially parallel to the substrate;
reducing the magnetic field to zero over a time greater than a relaxation time constant for the reference layer and greater than an additional relaxation time constant for the additional reference layer.

47. The method of claim 37 wherein the step of providing the free layer further includes:
defining a first height of the free layer in a direction normal to the substrate; and
wherein the step of providing the reference layer includes defining a second height of the reference layer in the direction, the first height being less than the second height.

48. The method of claim 37 wherein the step of providing the free layer further includes:
providing a plurality of domain wall motion barriers such that the free layer includes at least one domain wall, the plurality of stable states including the at least one domain wall residing substantially at at least one of the plurality of domain wall motion barriers.

* * * * *